US012666592B2

(12) United States Patent
Song et al.

(10) Patent No.: US 12,666,592 B2
(45) Date of Patent: Jun. 23, 2026

(54) METHODS OF MANUFACTURING SEMICONDUCTOR DEVICES

(71) Applicant: Samsung Electronics Co., Ltd.,
Suwon-si (KR)

(72) Inventors: Hoju Song, Suwon-si (KR); Eunjung Kim, Suwon-si (KR); Kihyung Nam, Suwon-si (KR); Jaehyung Park, Suwon-si (KR); Yunjae Lee, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 374 days.

(21) Appl. No.: 18/355,429

(22) Filed: Jul. 20, 2023

(65) Prior Publication Data

US 2024/0049445 A1 Feb. 8, 2024

(30) Foreign Application Priority Data

Aug. 2, 2022 (KR) ........................ 10-2022-0096102

(51) Int. Cl.
*H10B 12/00* (2023.01)
(52) U.S. Cl.
CPC ........... *H10B 12/09* (2023.02); *H10B 12/315* (2023.02); *H10B 12/50* (2023.02)
(58) Field of Classification Search
CPC .................................................... H10B 12/50
See application file for complete search history.

(56) References Cited

U.S. PATENT DOCUMENTS

| | | | |
|---|---|---|---|
| 10,978,459 B2 * | 4/2021 | Su ........................ | H10B 12/315 |
| 11,217,594 B2 * | 1/2022 | Huang ................ | H01L 21/7682 |
| 12,193,337 B2 * | 1/2025 | Ou ........................ | H10B 61/22 |
| 2006/0199368 A1 * | 9/2006 | Engelhardt ......... | H01L 21/7682 |
| | | | 257/773 |

(Continued)

FOREIGN PATENT DOCUMENTS

| | | | | |
|---|---|---|---|---|
| CN | 1832160 A | | 9/2006 | |
| CN | 111354728 A | * | 6/2020 | ......... H10D 30/6894 |

(Continued)

OTHER PUBLICATIONS

"Extended European Search Report dated Dec. 18, 2023, issued in corresponding European Application No. 23187201.1, 7 pages".

*Primary Examiner* — Edward Chin
(74) *Attorney, Agent, or Firm* — Wolf, Greenfield & Sacks, P.C.

(57) ABSTRACT

A method of manufacturing a semiconductor device may include forming word lines in word line trenches on a substrate, removing a portion of the substrate located between a pair of the word lines to form a direct contact hole, forming on an inner wall of the direct contact hole a sacrificial liner structure that includes a first liner, a sacrificial layer, and a second liner, forming a preliminary direct contact in the direct contact hole, removing the sacrificial layer, while leaving the first and second liners, to form an air space between the first and second liners, forming a bit line stack that covers an upper surface the air space on the preliminary direct contact, patterning the bit line stack to form bit lines, and removing side portions of the second liner and the preliminary direct contact in the direct contact hole to form a direct contact.

19 Claims, 31 Drawing Sheets

(56)  References Cited

U.S. PATENT DOCUMENTS

| 2016/0027727 A1* | 1/2016 | Kim ................... | H01L 21/7682 |
| | | | 257/774 |
| 2019/0103302 A1* | 4/2019 | Yoon ................. | H10B 12/0335 |
| 2019/0348418 A1* | 11/2019 | Hwang ................ | H10B 12/30 |

FOREIGN PATENT DOCUMENTS

| CN | 109979940 B | 3/2021 |
| TW | 2021-09760 A | 3/2021 |

* cited by examiner

FIG. 21

METHODS OF MANUFACTURING SEMICONDUCTOR DEVICES

CROSS-REFERENCE TO RELATED APPLICATION

This application is based on and claims priority under 35 U.S.C. § 119 to Korean Patent Application No. 10-2022-0096102, filed on Aug. 2, 2022, in the Korean Intellectual Property Office, and the entire contents of the above-identified application are incorporated by reference herein.

BACKGROUND

The present disclosure relates to methods of manufacturing semiconductor devices, and more particularly, to methods of manufacturing semiconductor devices including bit line structures.

According to downscaling of semiconductor devices, the size of individual microcircuit patterns for realizing semiconductor devices is being further reduced. In addition, the reduction in individual microcircuit patterns may increase the difficulty of a manufacturing process in a patterning process of a direct contact connecting a bit line to an active region.

SUMMARY

The present disclosure and the inventive concepts thereof provide methods of manufacturing semiconductor devices capable of reducing the difficulty of a direct contact patterning process.

According to some aspects of the inventive concepts, there is provided a method of manufacturing a semiconductor device, including forming a plurality of word lines in a plurality of word line trenches that extend in a first horizontal direction on a substrate, removing a portion of the substrate located between a pair of the plurality of word lines to form a direct contact hole, forming on an inner wall of the direct contact hole a sacrificial liner structure that includes a first liner, a sacrificial layer, and a second liner, forming a preliminary direct contact in the direct contact hole on the sacrificial liner structure, removing the sacrificial layer, while leaving the first liner and the second liner, to form an air space between the first liner and the second liner, forming a bit line stack that covers an upper surface of the air space on the preliminary direct contact, patterning the bit line stack to form a plurality of bit lines that extend in a second horizontal direction that crosses the first horizontal direction, and removing side portions of the second liner and the preliminary direct contact in the direct contact hole to form a direct contact.

According to some aspects of the inventive concepts, there is provided a method of manufacturing a semiconductor device, including forming an interface structure in an interface area of a substrate, forming a plurality of word lines that extend in a first horizontal direction on a cell area of a substrate, removing a portion of the substrate located between a pair the plurality of word lines to form a direct contact hole, forming on an inner wall of the direct contact hole a sacrificial liner structure including a first liner, a sacrificial layer, and a second liner, forming a preliminary direct contact in the direct contact hole on the sacrificial liner structure, removing the sacrificial layer, while leaving the first liner and the second liner, to form an air space between the first liner and the second liner, forming on the cell area and on the interface area a bit line stack that contacts the preliminary direct contact and that covers the air space, the bit line stack including a first conductive layer, a second conductive layer, and a third conductive layer, patterning the bit line stack to form a plurality of bit lines that extend in a second horizontal direction that crosses the first horizontal direction, and removing side portions of the second liner and the preliminary direct contact in the direct contact hole to form a direct contact.

According to some aspects of the inventive concepts, there is provided a method of manufacturing a semiconductor device, including forming an interface structure in an interface area of the substrate, forming a plurality of word line trenches that extend in a first horizontal direction on a cell area of a substrate, forming a plurality of word lines in the plurality of word line trenches, removing a portion of the substrate located between a pair the plurality of word lines to form a direct contact hole, forming on an inner wall of the direct contact hole a sacrificial liner structure including a first liner, a sacrificial layer, and a second liner, on an inner wall of the direct contact hole, forming a preliminary direct contact in the direct contact hole on the sacrificial liner structure, planarizing an upper side of the preliminary direct contact and an upper side of the sacrificial liner structure so that an upper surface of the sacrificial layer is exposed, removing the sacrificial layer to form an air space around the preliminary direct contact, forming, on the cell area and the interface area, a bit line stack that contacts the preliminary direct contact and that covers the air space, the bit line stack including a first conductive layer, a second conductive layer, and a third conductive layer, the first conductive layer covering an inlet of the air space, and patterning the bit line stack to form a plurality of bit lines extending in a second horizontal direction and removing a side portion of the preliminary direct contact to form a direct contact.

BRIEF DESCRIPTION OF THE DRAWINGS

Embodiments will be more clearly understood from the following detailed description taken in conjunction with the accompanying drawings in which:

FIGS. 6A to 22 are cross-sectional views illustrating a method of manufacturing a semiconductor device, according to some embodiments, wherein FIGS. 6A, 8, 9A, 10A, 11, 12, 13A, 16, 17A, 18A, 20A, 21 and 22 are cross-sectional views taken along line B1-B1' of FIG. 2, FIGS. 6B, 7, 9B, and 10B are cross-sectional views taken along line B2-B2' of FIG. 2, and FIGS. 13B, 14, 15, 17B, 18B, 19, and 20B are cross-sectional views corresponding to a portion CX1 of FIG. 13A.

DETAILED DESCRIPTION

Hereinafter, some embodiments of are described in detail with reference to the accompanying drawings.

Figure 1:
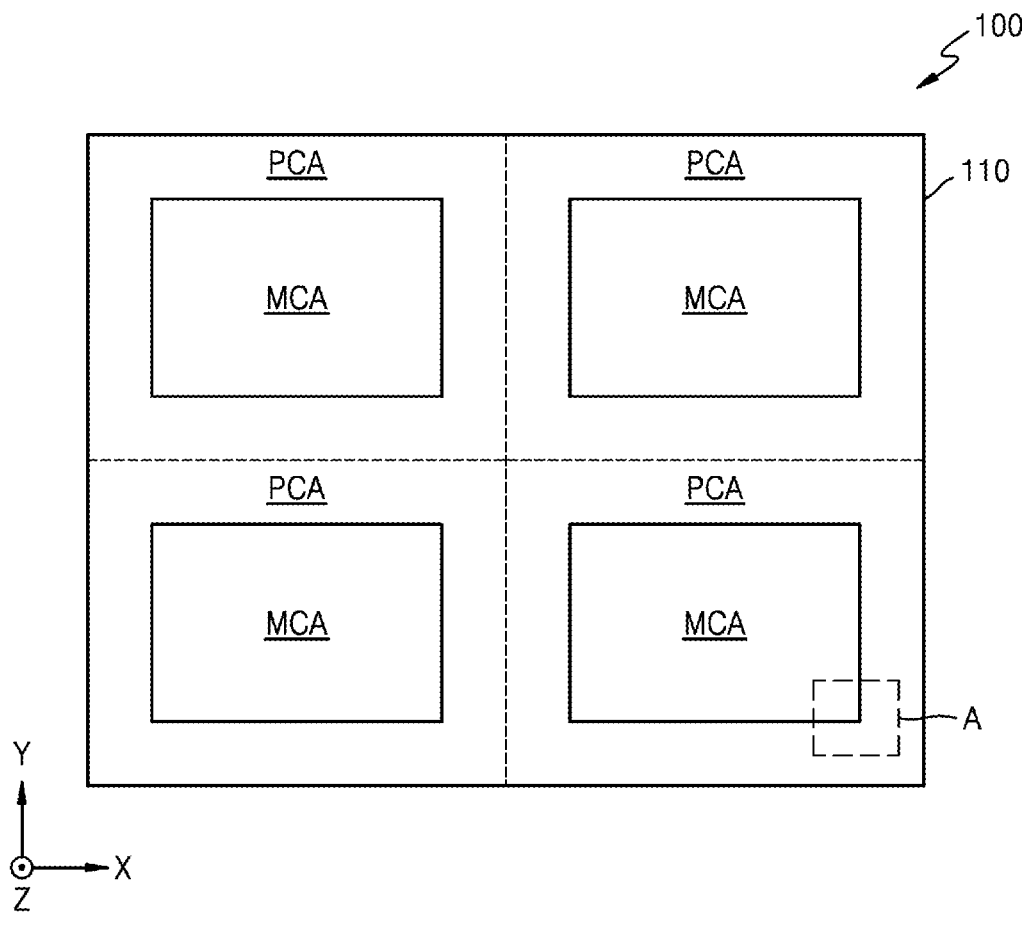
FIG. 1 is a layout diagram illustrating a semiconductor device according to some embodiments.
Figure 2:
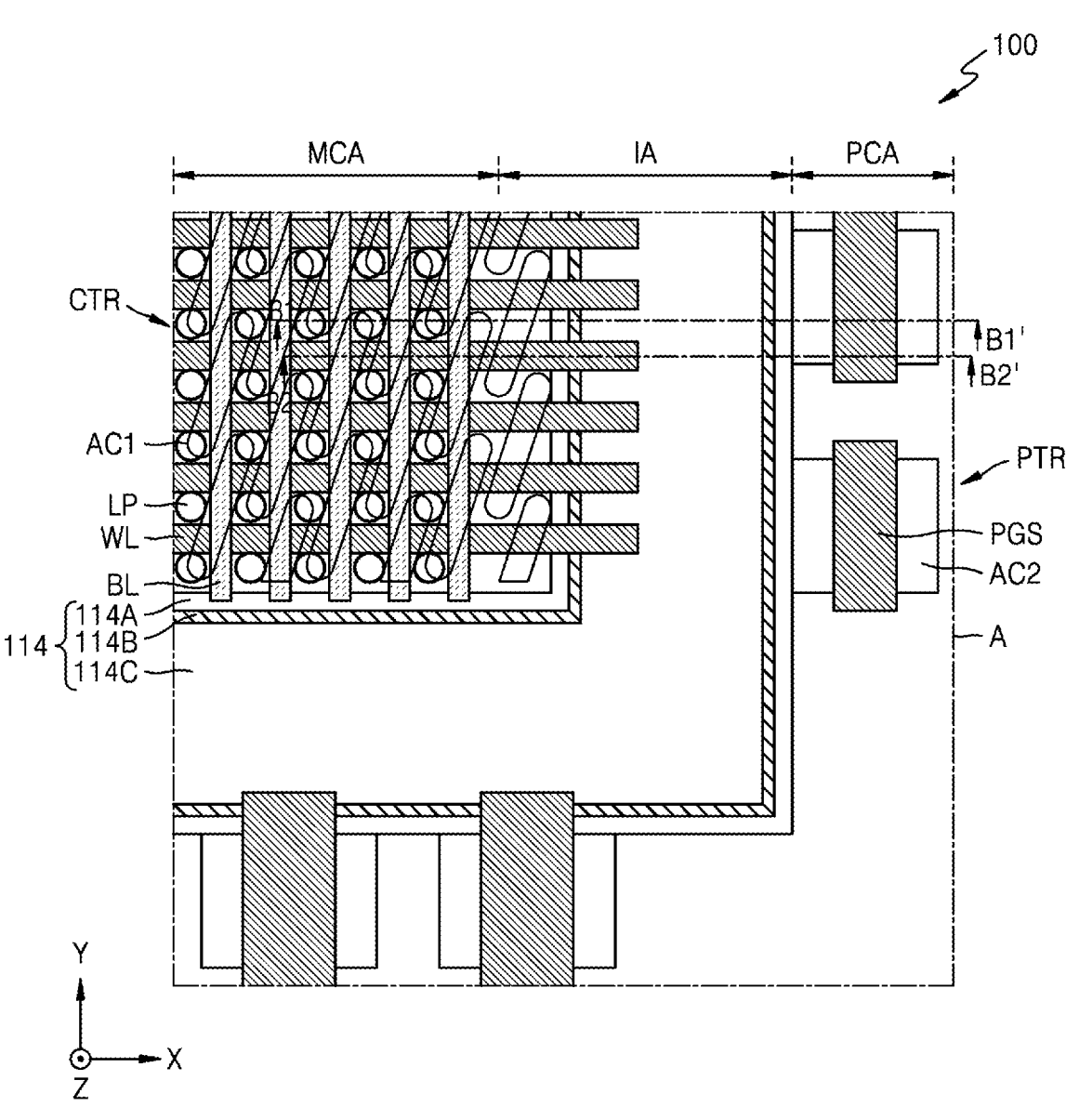
FIG. 2 is an enlarged layout diagram of a portion A of FIG. 1.
Figure 3:
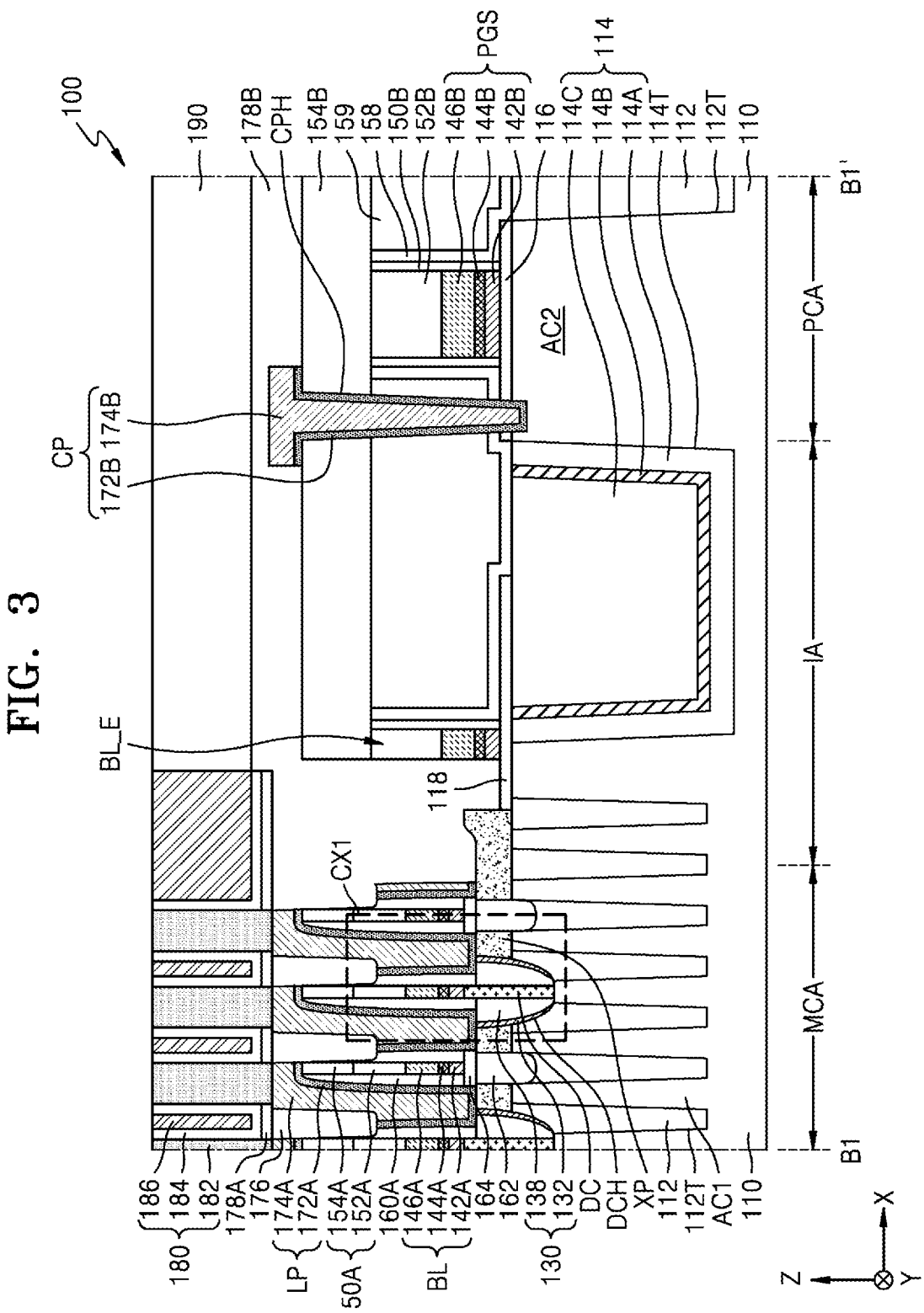
FIG. 3 is a cross-sectional view taken along line B1-B1' of FIG. 2.
Figure 4:
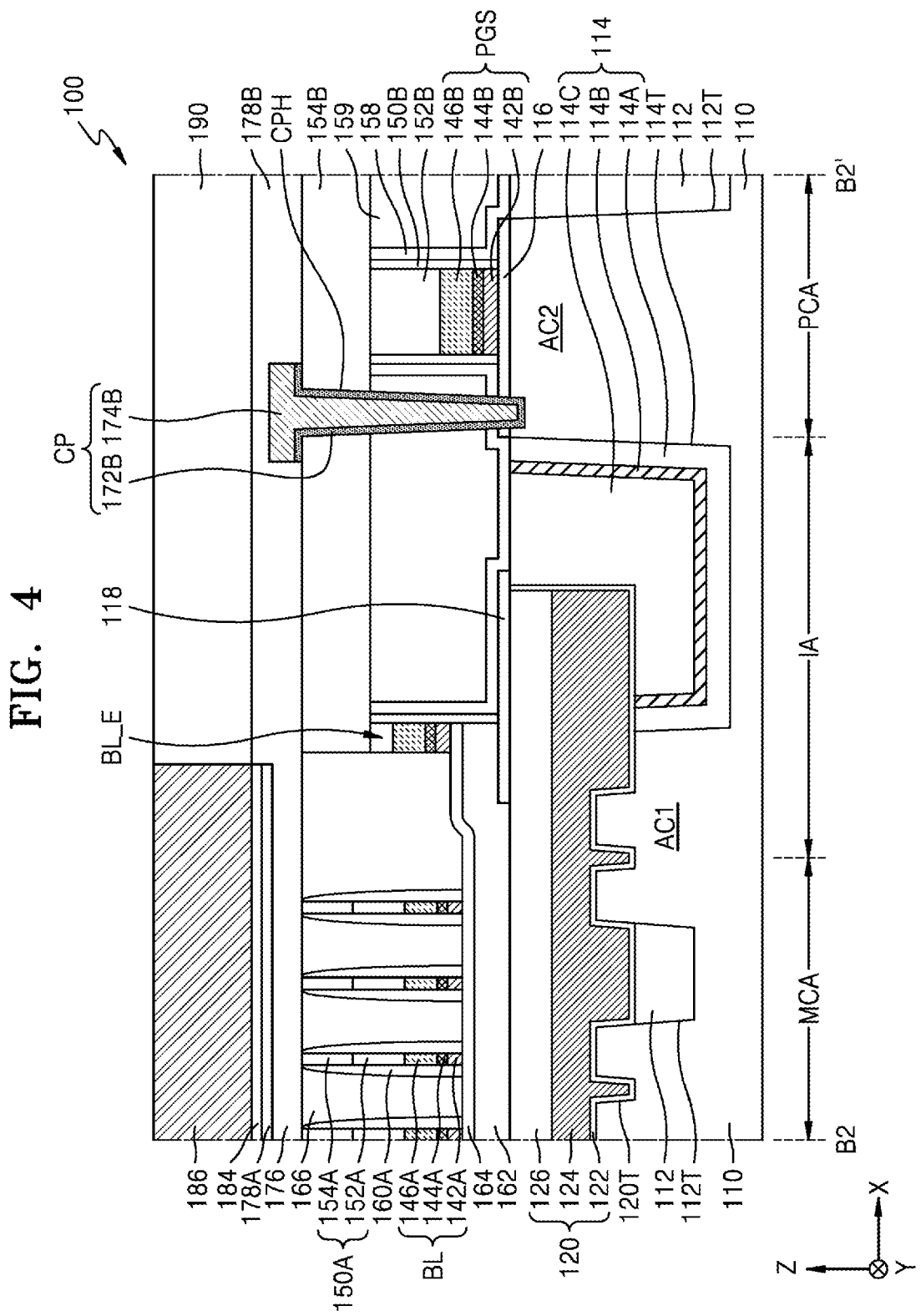
FIG. 4 is a cross-sectional view taken along line B2-B2' of FIG. 2.
Figure 5:
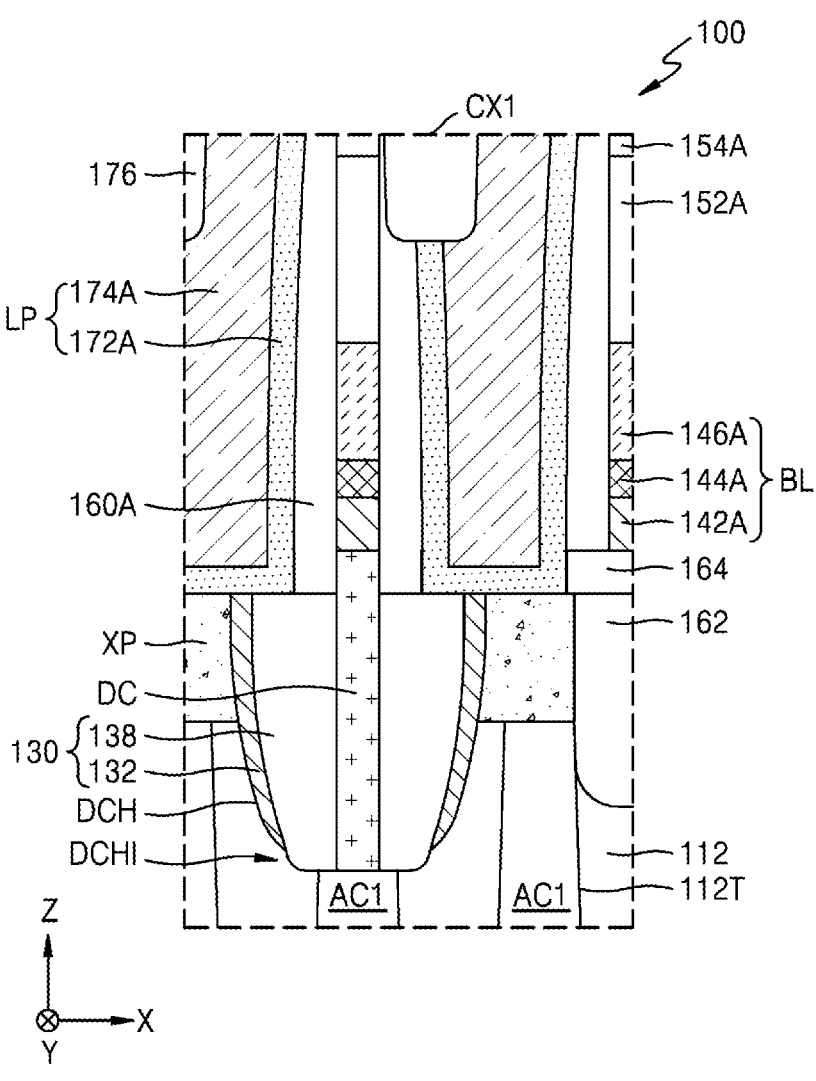
FIG. 5 is an enlarged cross-sectional view of a portion CX1 of FIG. 3.

FIG. 1 is a layout diagram illustrating a semiconductor device 100 according to some embodiments. FIG. 2 is an enlarged layout diagram of a portion A of FIG. 1. FIG. 3 is a cross-sectional view taken along line B1-B1' of FIG. 2. FIG. 4 is a cross-sectional view taken along line B2-B2' of FIG. 2. FIG. 5 is an enlarged cross-sectional view of a portion CX1 of FIG. 3.

Referring to FIGS. 1 to 5, the semiconductor device 100 may include a substrate 110 including a cell array area MCA and a peripheral circuit area PCA. The cell array area MCA may be a memory cell area of a dynamic random-access memory (DRAM) device, and the peripheral circuit area PCA may be a core area or a peripheral circuit area of the DRAM device. For example, the cell array area MCA may include a cell transistor CTR and a capacitor structure 180 connected thereto, and the peripheral circuit area PCA may include a peripheral circuit transistor PTR configured to transfer signals and/or power to a cell transistor CTR included in the cell array area MCA. In embodiments, the peripheral circuit transistor PTR may include or be configured with various circuits, such as a command decoder, a control logic, an address buffer, a row decoder, a column decoder, a sense amplifier, and/or a data input/output (I/O) circuit.

A device isolation trench 112T may be formed in the substrate 110, and a device isolation layer 112 may be formed in the device isolation trench 112T. The device isolation layer 112 may define a plurality of first active regions AC1 in the cell array area MCA of the substrate 110, and a plurality of second active regions AC2 may be defined by the device isolation layer 112 in the peripheral circuit area PCA of the substrate 110.

An interface trench 114T may be formed in an interface area IA between the cell array area MCA and the peripheral circuit area PCA, and an interface structure 114 may be formed in the interface trench 114T. In a plan view, the interface trench 114T may be located to surround the cell array area MCA (e.g., four surfaces of the cell array area MCA). The interface structure 114 may include a buried insulating layer 114A, an insulating liner 114B, and a gap-fill insulating layer 114C located inside the interface trench 114T.

The buried insulating layer 114A may be on and may conform to an inner wall of the interface trench 114T. In some embodiments, the buried insulating layer 114A may include silicon oxide. For example, the buried insulating layer 114A may include silicon oxide formed by an atomic layer deposition (ALD) process, a chemical vapor deposition (CVD) process, a plasma enhanced CVD (PECVD) process, a low pressure CVD (LPCVD) process, or the like.

The insulating liner 114B may be on the inner wall of the interface trench 114T and may be on an inner wall of the buried insulating layer 114A. The insulating liner 114B may conform to the inner wall of the interface trench 114T and/or the inner wall of the buried insulating layer 114A. In some embodiments, the insulating liner 114B may include silicon nitride. For example, the insulating liner 114B may include silicon nitride formed by an ALD process, a CVD process, a PECVD process, an LPCVD process, or the like.

The gap-fill insulating layer 114C on the insulating liner 114B may be in a remaining portion and/or may fill the inside of the interface trench 114T. In some embodiments, the gap-fill insulating layer 114C may include silicon oxide, such as tonen silazene (TOSZ), undoped silicate glass (USG), boro-phospho-silicate glass (BPSG), phosphosilicate glass (PSG), flowable oxide (FOX), plasma enhanced deposition of tetra-ethyl-ortho-silicate (PE-TEOS) or fluoride silicate glass (FSG).

In the cell array area MCA, the first active regions AC1 may be arranged to have major axes in a horizontal diagonal direction with respect to a first horizontal direction X and a second horizontal direction Y, respectively. A plurality of word lines WL may extend in parallel to each other in the first horizontal direction X across the first active regions AC1. A plurality of bit lines BL may extend in parallel to each other in the second horizontal direction Y on the word lines WL. The bit lines BL may be respectively connected to the first active regions AC1 through direct contacts DC.

A plurality of cell pads XP may be formed between two adjacent bit lines BL among the bit lines BL. The cell pads XP may be arranged in a line in the first horizontal direction X and the second horizontal direction Y. A plurality of landing pads LP may be respectively formed on the cell pads XP. The cell pads XP and the landing pads LP may connect a lower electrode 182 of a capacitor structure 180 that is formed above the bit lines BL to the first active region AC1. Each of the landing pads LP may at least partially overlap the cell pad XP.

The substrate 110 may include silicon, for example, single crystal silicon, polycrystalline silicon, or amorphous silicon. In other embodiments, the substrate 110 may include at least one compound or element selected from the group consisting of Ge, SiGe, SiC, GaAs, InAs, and InP. In some embodiments, the substrate 110 may include a conductive region, for example, a well doped with an impurity or a structure doped with an impurity. The device isolation layer 112 may include an oxide layer, a nitride layer, or combinations thereof.

In the cell array area MCA, a plurality of word line trenches 120T extending in the first horizontal direction X are arranged in the substrate 110, and a buried gate structure 120 may be located in the word line trenches 120T. The buried gate structure 120 may include a plurality of gate dielectric layers 122, a plurality of gate electrodes 124, and a plurality of capping insulating layers 126 located in the word line trenches 120T, respectively. The gate electrodes 124 may respectively correspond to the word lines WL illustrated in FIG. 1.

The gate dielectric layers 122 may include a silicon oxide layer, a silicon nitride layer, a silicon oxynitride layer, an oxide/nitride/oxide (ONO) layer, or a high-k dielectric film having a dielectric constant higher than that of the silicon oxide layer. The gate electrodes 124 may include Ti, TiN, Ta, TaN, W, WN, TiSiN, WSiN, or combinations thereof. The capping insulating layers 126 may include a silicon oxide layer, a silicon nitride layer, a silicon oxynitride layer, or combinations thereof.

The word line trenches 120T may extend from the cell array area MCA into the interface area IA, and an end portion of each of the word line trenches 120T may at least partially vertically overlap the interface structure 114 in the interface area IA.

A buffer layer 118 may be formed on the substrate 110, the buried gate structure 120, and the interface structure 114 in the interface area IA. The buffer layer 118 may include an oxide layer, a nitride layer, or combinations thereof.

A plurality of direct contacts DC may be formed in direct contact holes DCH in the substrate 110. The direct contacts DC and direct contact holes DCH may be located between a pair of the plurality of word lines WL. The direct contacts DC may be respectively connected to the first active regions AC1. The direct contacts DC may include doped polysilicon, TiN, TiSiN, W, tungsten silicide, or combinations thereof.

The direct contacts DC may include first and second sidewalls spaced apart from each other in the first horizontal direction X, and the first and second sidewalls thereof may have substantially vertical or straight profiles. For example, the direct contacts DC may have steep vertical sidewalls without a tail or tapered portion at the bottom thereof. For example, the direct contacts DC may have a vertical cross-section having a rectangular shape.

A direct contact spacer 130 may be on an inner wall of the direct contact hole DCH. The direct contact spacer 130 may be on a lower sidewall of the direct contact hole DCH and may cover a lower side of the direct contact DC.

In some embodiments, the direct contact spacer 130 may include a first liner 132 and an insulating spacer 138. For example, the first liner 132 may be formed on the inner wall of the direct contact hole DCH and conform thereto, and the first liner 132 may have a relatively small thickness. In some embodiments, the first liner 132 may not be on the inner wall of the direct contact hole DCH adjacent to the direct contact DC, and the first liner 132 may be spaced apart from the direct contact DC.

In some embodiments, the first liner 132 may be a portion of a sacrificial liner structure 130S (refer to FIG. 13A) formed in the direct contact hole DCH. For example, the sacrificial liner structure 130S that includes a first liner 132, a sacrificial layer 134, and a second liner 136 may be formed in the direct contact hole DCH, and after a preliminary direct contact DCP is formed, the sacrificial layer 134 may be selectively removed to form an air space AS (refer to FIG. 15) between the first liner 132 and the second liner 136, and a portion of the first liner 132 may be exposed to be removed in an etching atmosphere during a process of patterning a bit line stack BLS and the direct contact DC. As best seen in FIG. 5, an inflection portion DCHI of the direct contact hole DCH may be formed at the bottom of the first liner 132 through the patterning process using the air space AS. The inflection portion DCHI of the direct contact hole DCH may indicate a first portion of the bottom portion of the direct contact hole DCH that is not covered by the first liner 132, and the first portion may be extended or recessed downwardly further than a second portion of the bottom portion of the direct contact hole DCH covered by the first liner 132.

In some embodiments, the first liner 132 may include silicon nitride or silicon oxynitride, and the insulating spacer 138 may include silicon nitride or silicon oxynitride.

The bit lines BL may extend in the second horizontal direction Y on the substrate 110 and the direct contacts DC. Each of the bit lines BL may be connected to the first active region AC1 through the direct contacts DC.

In some embodiments, each of the bit lines BL may include a first conductive layer 142A, a second conductive layer 144A, and a third conductive layer 146A sequentially stacked on the substrate 110 and the direct contact DC.

In some embodiments, the first conductive layer 142A may include doped polysilicon. The second conductive layer 144A may include at least one of titanium silicide, titanium silicon nitride, tantalum silicide, tantalum silicon nitride, tungsten silicide, and cobalt silicide. The third conductive layer 146A may include at least one of tungsten, ruthenium, cobalt, tungsten nitride, and ruthenium nitride.

In some embodiments, the first conductive layer 142A may include a material having poor step coverage. For example, the material of the first conductive layer 142A may exhibit a tendency to be non-uniform in thickness and/or non-conforming to sidewalls of components. In this case, in the process of forming the bit line stack (BLS) (refer to FIG. 17A) including the first conductive layer 142A, the second conductive layer 144A, and the third conductive layer 146A, the first conductive layer 142A may cover an upper portion of the air space AS, while the poor step coverage of the material of the first conductive layer 142A results in the air space AS of the sacrificial liner structure 130S remaining unfilled.

Each of the bit lines BL may be covered with a plurality of insulating capping structures 150A. The insulating capping structures 150A may extend above the bit lines BL and may extend in length in the second horizontal direction Y. The insulating capping structures 150A may include a lower capping pattern 152A and an upper capping pattern 154A.

A bit line spacer 160A may be on first and second sidewalls in the first horizontal direction X of each of the bit lines BL. The bit line spacer 160A may extend on the first and second sidewalls of the bit lines BL and may extend in length in the second horizontal direction Y. A bottom surface of the bit line spacer 160A may be on the direct contact spacer 130. Although the bit line spacer 160A is illustrated as a single material layer in FIG. 3, in other embodiments, the bit line spacer 160A may be formed in a stacked structure of a plurality of spacer layers (not shown), and at least one of the spacer layers may be an air spacer.

In some embodiments, after the bit line stack BLS and a preliminary direct contact DCP are patterned during an etching process (e.g., the same etching process) to form the bit line BL and the direct contact DC, respectively, the direct contact spacer 130 may be first formed in the direct contact hole DCH, and the bit line spacer 160A may then be formed on the sidewall of the bit line BL. In this case, a bottom surface of the bit line spacer 160A may cover an upper surface of the direct contact spacer 130.

The cell pads XP may be located between a pair of the bit lines BL. For example, one cell pad XP may be located between two adjacent bit lines BL at a vertical level lower than the bit line BL. In some embodiments, an insulating pattern 162 may be between two cell pads XP arranged in the first horizontal direction X and between two cell pads XP arranged in the second horizontal direction Y, and the insulating pattern 162 may electrically isolate two adjacent cell pads XP. Also, a sidewall of the cell pad XP may contact the direct contact spacer 130. Alternatively, in some embodiments, an upper side of the sidewall of the cell pad XP may be in contact with a sidewall of a bottom portion of the bit line spacer 160A.

In some embodiments, the cell pads XP may include Si, Ge, W, WN, Co, Ni, Al, Mo, Ru, Ti, TiN, Ta, TaN, Cu, TiSiN, tungsten silicides, or combinations thereof. As illustrated in FIG. 3, a bottom surface of each of the cell pads XP may have a flat profile. In other embodiments, the bottom surface of each of the cell pads XP may include a first portion in contact with the upper surface of the substrate 110 and located at a first vertical level and a second portion in contact with the upper surface of the device isolation layer 112 and located at a second vertical level lower than the first vertical level, so that a step is formed at the bottom portion of each of the cell pads XP.

An insulating layer 164 may be on the insulating pattern 162, and a bit line BL may be on the insulating layer 164. As illustrated in FIG. 3, the insulating layer 164 may have a greater width than that of the bit line BL, and the bottom surface of the bit line spacer 160A may be disposed on an upper surface of the insulating layer 164. In other embodiments, the insulating layer 154 may have the same width as that of the bit line BL, and a sidewall of the insulating layer 164 may be covered by the bit line spacer 160A.

As best seen in FIG. 4, a plurality of insulating fences 166 may be arranged in the first horizontal direction X between two adjacent bit lines BL. The insulation fences 166 may be on the insulation layer 164 at positions vertically overlapping the word line trenches 120T.

A plurality of landing pads LP may be respectively on the cell pads XP. Each of the landing pads LP may include a conductive barrier layer 172A and a landing pad conductive layer 174A. The conductive barrier layer 172A may include Ti, TiN, or combinations thereof. The landing pad conductive layer 174A may include metal, metal nitride, conductive polysilicon, or combinations thereof. For example, the landing pad conductive layer 174A may include tungsten. The landing pads LP may have a plurality of island-like pattern shapes in a plan view.

The landing pads LP may be electrically insulated from each other by an insulating pattern 176 surrounding the landing pads LP. The insulating pattern 176 may include at least one of silicon nitride, silicon oxide, and silicon oxynitride.

A first etch stop layer 178A may be on the landing pad LP and the insulating pattern 176 in the cell array area MCA. A capacitor structure 180 may be on the first etch stop layer 178A. The capacitor structure 180 may include a plurality of lower electrodes 182, a capacitor dielectric layer 184, and an upper electrode 186.

The lower electrodes 182 may pass through the first etch stop layer 178A and be connected with or extend from the landing pads LP in a vertical direction Z. Bottom portions of the lower electrodes 182 may pass through the first etch stop layer 178A to be connected to the landing pads LP. The capacitor dielectric layer 184 may be on the lower electrodes 182. The upper electrode 186 may be on the capacitor dielectric layer 184 and may cover the lower electrodes 182.

In some embodiments, the capacitor dielectric layer 184 may include at least one of zirconium oxide, hafnium oxide, titanium oxide, niobium oxide, tantalum oxide, yttrium oxide, strontium titanium oxide, barium strontium titanium oxide, scandium oxide, and lanthanide oxide. The lower electrode 182 and the upper electrode 186 may include at least one selected from metals, such as ruthenium (Ru), titanium (Ti), tantalum (Ta), niobium (Nb), iridium (Jr), molybdenum (Mo), and tungsten (W), conductive metal nitrides, such as titanium nitride (TiN), tantalum nitride (TaN), niobium nitride (NbN), molybdenum nitride (MoN), and tungsten nitride (WN), and conductive metal oxides, such as iridium oxide ($IrO_2$), ruthenium oxide ($RuO_2$), and strontium ruthenium oxide ($SrRuO_3$).

In some embodiments, the lower electrodes 182 may have a pillar shape extending in the vertical direction Z, and the lower electrodes 182 may have a circular horizontal cross-section. However, the lower electrodes 182 are not limited to a horizontal cross-sectional shape and may have various polygonal and rounded polygonal horizontal cross-sections, such as an ellipse, a square, a rounded square, a rhombus, a trapezoid, and the like. In addition, in FIG. 3, the lower electrodes 182 are illustrated as having a pillar shape having a circular horizontal cross-section in the entire height thereof, but in other embodiments, the lower electrodes 182 may have a cylinder shape with a closed bottom.

A peripheral circuit transistor PTR may be located on the second active region AC2 in the peripheral circuit area PCA. The peripheral circuit transistor PTR may include a gate dielectric layer 116, a peripheral circuit gate electrode PGS, and a gate capping pattern 152B sequentially stacked on the second active region AC2.

The gate dielectric layer 116 may include at least one selected from a silicon oxide layer, a silicon nitride layer, a silicon oxynitride layer, an ONO, or a high-k film having a dielectric constant higher than that of the silicon oxide layer. The gate capping pattern 152B may include a silicon nitride layer.

The peripheral circuit gate electrode PGS may include a first conductive layer 142B, a second conductive layer 144B, and a third conductive layer 146B. In embodiments, the first conductive layer 142B may include Si, Ge, W, WN, Co, Ni, Al, Mo, Ru, Ti, TiN, Ta, TaN, Cu, or combinations thereof. The second conductive layer 144B and the third conductive layer 146B may include TiN, TiSiN, W, tungsten silicide, or combinations thereof.

In some embodiments, constituent materials of the first conductive layer 142B, the second conductive layer 144B, and the third conductive layer 146B may be the same as constituent materials of the first conductive layer 142A, the second conductive layer 144A, and the third conductive layer 146A included in bit line BL in the cell array area MCA, respectively. For example, the peripheral circuit gate electrode PGS may be simultaneously formed in the process of forming the bit line BL. However, the inventive concepts are not limited thereto.

First and second sidewalls in the first horizontal direction X of the peripheral circuit gate electrode PGS and the gate capping pattern 152B may be covered with an insulating spacer 150B. The insulating spacer 150B may include an oxide layer, a nitride layer, or combinations thereof. The peripheral circuit transistor PTR and the insulating spacer 150B may be covered by a protective layer 158, and a first interlayer insulating layer 159 may be on the protective layer 158 to fill a space between two adjacent peripheral circuit transistors PTR. An upper insulating capping layer 154B may be on the first interlayer insulating layer 159 and the protective layer 158.

A contact plug CP may be formed in a contact hole CPH that vertically passes or extends through the first interlayer insulating layer 159 and the upper insulating capping layer 154B in the peripheral circuit area PCA. The contact plug CP may include a conductive barrier layer 172B and a landing pad conductive layer 174B, similarly to the landing pads LP formed in the cell array area MCA. A metal silicide layer (not shown) may be located between the second active region AC2 and the contact plug CP.

A second etch stop layer 178B covering the contact plug CP may be on the upper insulating capping layer 154B. A second interlayer insulating layer 190 covering the capacitor structure 180 may be on the second etch stop layer 178B.

As shown in FIG. 3, an outermost cell pad XP, among the cell pads XP, may extend to the interface area IA. The cell pad XP located in the interface area IA may be referred to as a cell pad extension XP_E (refer to FIG. 16). Also, an edge conductive layer BL_E may be on the interface area IA. The edge conductive layer BL_E may indicate a portion of the bit line stack BLS for forming the bit line BL that remains after the process of patterning the bit line BL. However, in some embodiments, a process of removing the edge conductive layer BL_E may be further performed, and in this case, the edge conductive layer BL_E may be omitted.

According to embodiments described above, the bit line stack BLS may be formed when the air space surrounding the preliminary direct contact DCP is formed inside the direct contact hole DCH, the bit line may be formed by patterning the bit line stack BLS, and the direct contact DC may be formed by patterning the preliminary direct contact DCP. Accordingly, in the process of forming the direct contact DC, a supply path of an etching gas through the air space AS may be secured, and the difficulty of the process of forming the direct contact DC may be reduced.

FIGS. 6A to 22 are cross-sectional views illustrating a method of manufacturing the semiconductor device 100, according to embodiments. In greater detail, FIGS. 6A, 8, 9A, 11, 12, 13A, 16, 17A, 18A, 20A, 21 and 22 are cross-sectional views taken along line B1-B1' of FIG. 2, FIGS. 6B, 7, 9A, and 10B are cross-sectional views taken along line B2-B2' of FIG. 2, and FIGS. 13B, 14, 15, 17B, 18B, 19, and 20B are cross-sectional views corresponding to a portion CX1 of FIG. 13A. In FIGS. 6A to 22, the same reference numerals as those of FIGS. 1 to 5 denote the same components.

Figure 6A:
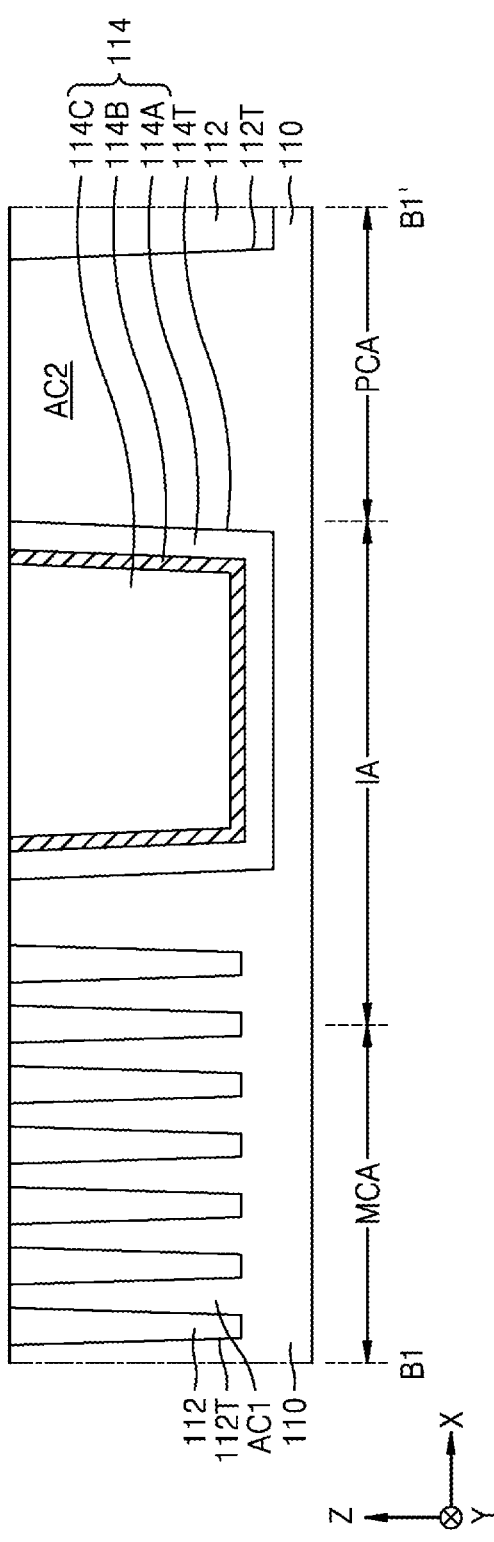
Figure 6B:
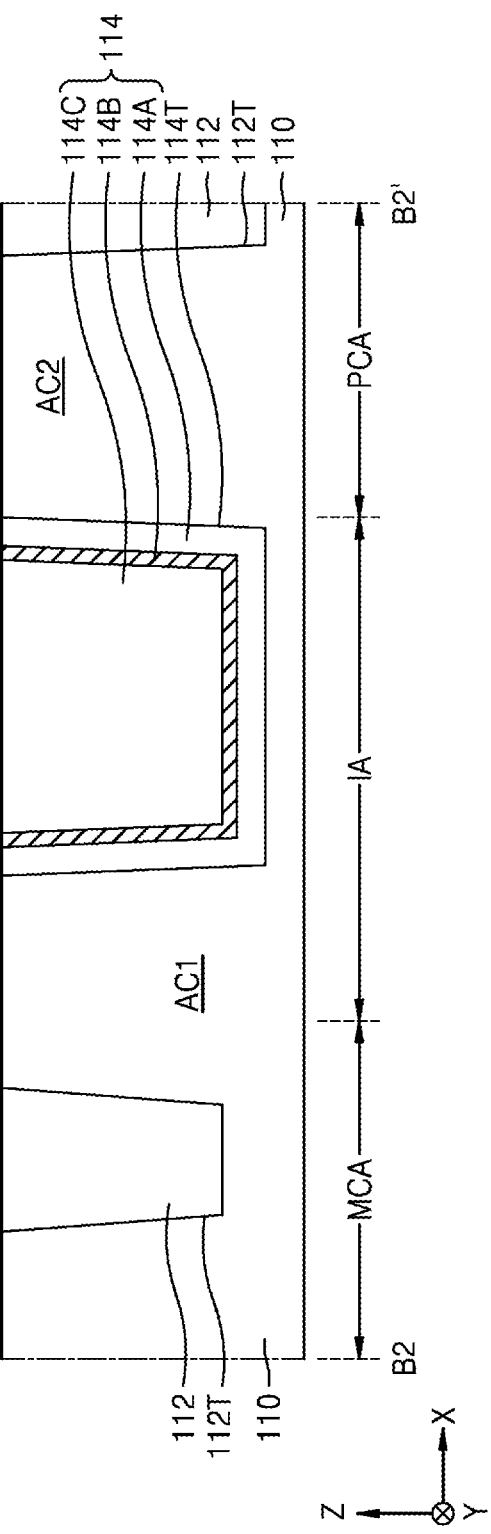

Referring to FIGS. 6A and 6B, a plurality of device isolation trenches 112T may be formed in the cell array area MCA and the peripheral circuit area PCA of the substrate 110, and the interface trench 114T may be formed in the interface area IA of the substrate 110.

Thereafter, the device isolation layer 112 in the device isolation trenches 112T may be formed in the cell array area MCA and the peripheral circuit area PCA. By the formation of the device isolation layer 112, a plurality of first active regions AC1 may be defined in the cell array area MCA of the substrate 110 and a second active region AC2 is defined in the peripheral circuit area PCA.

In some embodiments, the device isolation layer 112 may be formed using silicon oxide, silicon nitride, silicon oxynitride, or combinations thereof. In some examples, the device isolation layer 112 may have a double-layer structure including a silicon oxide layer and a silicon nitride layer, but is not limited thereto.

Thereafter, the buried insulating layer 114A, the insulating liner 114B, and the gap-fill insulating layer 114C may be sequentially formed on the inner wall of the interface trench 114T, and upper portions of the buried insulating layer 114A, the insulating liner 114B, and the gap-fill insulating layer 114C may be planarized so that the upper surface of the substrate 110 is exposed, to form the interface structure 114.

In some embodiments, the buried insulating layer 114A may be formed using an ALD process, a CVD process, a PECVD process, an LPCVD process, or the like. In some embodiments, the process of forming the buried insulating layer 114A may be performed at the same stage as at least some stages of the process of forming the device isolation layer 112, but the present disclosure is not limited thereto. In other embodiments, the process of forming the buried insulating layer 114A may be separately performed after the process of forming the device isolation layer 112.

In embodiments, the insulating liner 114B may be formed using silicon nitride by an ALD process, a CVD process, a PECVD process, an LPCVD process, or the like. The gap-fill insulating layer 114C may be formed on the insulating liner 114B to fill the interface trench 114T. The gap-fill insulating layer 114C may be formed to have a thickness sufficient to completely fill the remaining portion inside the interface trench 114T.

In some embodiments, the gap-fill insulating layer 114C may include silicon oxide, such as TOSZ, USG, BPSG, PSG, FOX, PE-TEOS or FSG.

Figure 7:
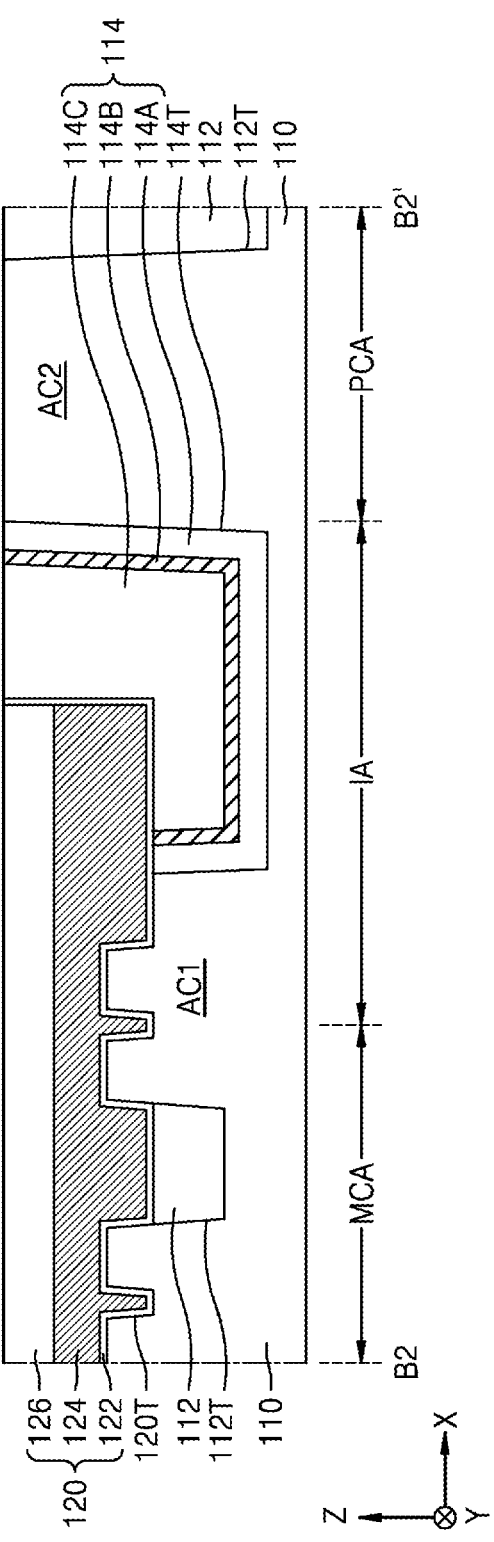

Referring to FIG. 7, a mask pattern (not shown) may be formed on the substrate 110, and a portion of the cell array area MCA of the substrate 110 may be removed using the mask pattern as an etch mask to form the word line trench 120T.

The word line trench 120T may extend from the cell array area MCA to a portion of the interface area IA. For example, a mask pattern for forming the word line trench 120T may be formed using a double patterning technique (DPT) or a quadruple patterning technique (QPT), but the present disclosure is not limited thereto.

Thereafter, the gate dielectric layer 122, the gate electrode 124, and the capping insulating layer 126 may be sequentially formed in the word line trench 120T.

For example, the gate dielectric layer 122 may be on and conform to the inner wall of the word line trench 120T. The gate electrode 124 may be formed by filling the word line trench 120T with a conductive layer (not shown) and then exposing again an upper portion of the word line trench 120T by etching back an upper portion of the conductive layer. The capping insulating layer 126 may be formed by filling a portion (e.g., a remaining portion) of the word line trench 120T with an insulating material and planarizing the insulating material until an upper surface of the buried insulating layer 114A is exposed.

Figure 8:
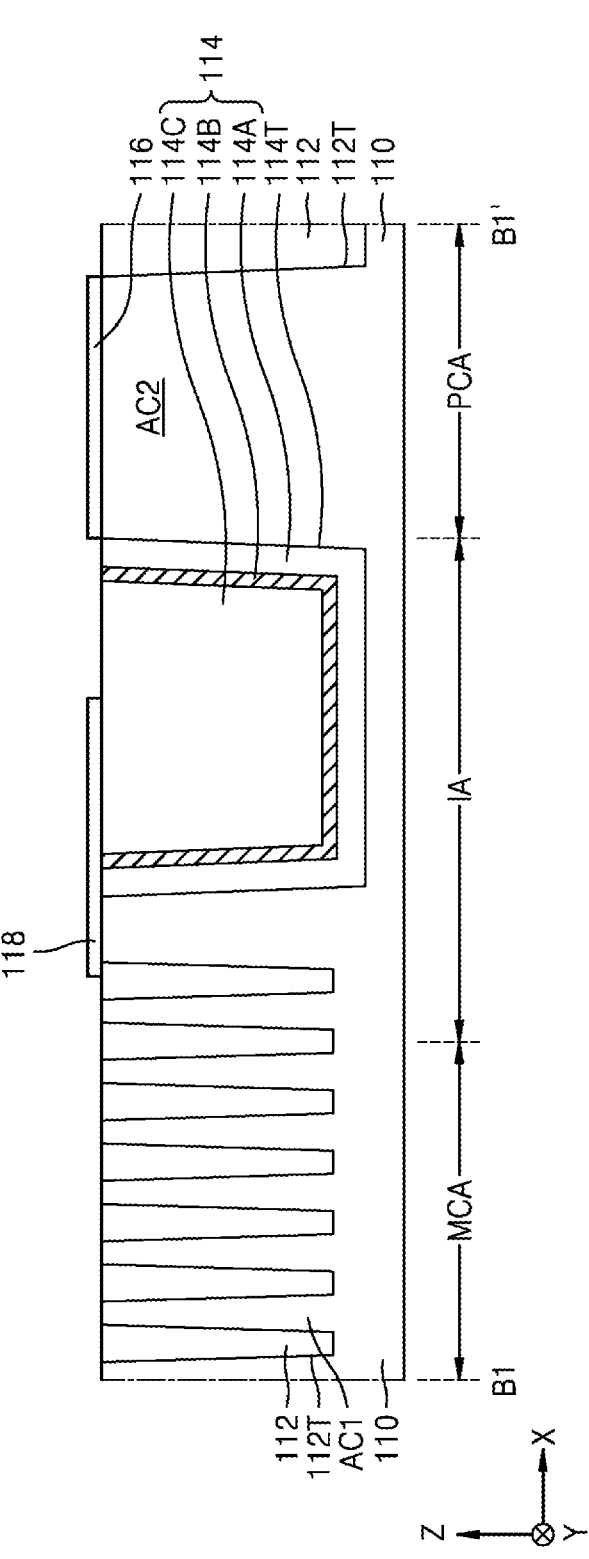

Referring to FIG. 8, a buffer layer 118 may be formed on the cell array area MCA and the interface area IA. The buffer layer 118 may cover a portion of an upper surface of the first active region AC1 in the cell array area MCA, and an upper surface of the second active region AC2 in the peripheral circuit area PCA may not be covered with the buffer layer 118.

Thereafter, the gate dielectric layer 116 may be formed on the substrate 110 in the peripheral circuit area PCA. The gate dielectric layer 116 may be formed by a thermal oxidation process, an ALD process, a CVD process, a PECVD process, an LPCVD process, or the like.

Thereafter, a portion of the buffer layer 118 covering the cell array area MCA may be removed, and the buffer layer 118 may be left on the interface area IA. The buffer layer 118 may cover the upper surfaces of the first active region AC1 and the device isolation layer 112 in an edge region of the cell array area MCA, and may extend to the interface structure 114.

In some embodiments, a recess process may be performed on the upper surface of the device isolation layer 112 of the cell array area MCA so that the upper surface of the first active region AC1 may be at a higher level than the upper surface of the device isolation layer 112 and a portion of the sidewall of the first active region AC1 may be exposed. However, the inventive concepts are not limited thereto.

Figure 9A:
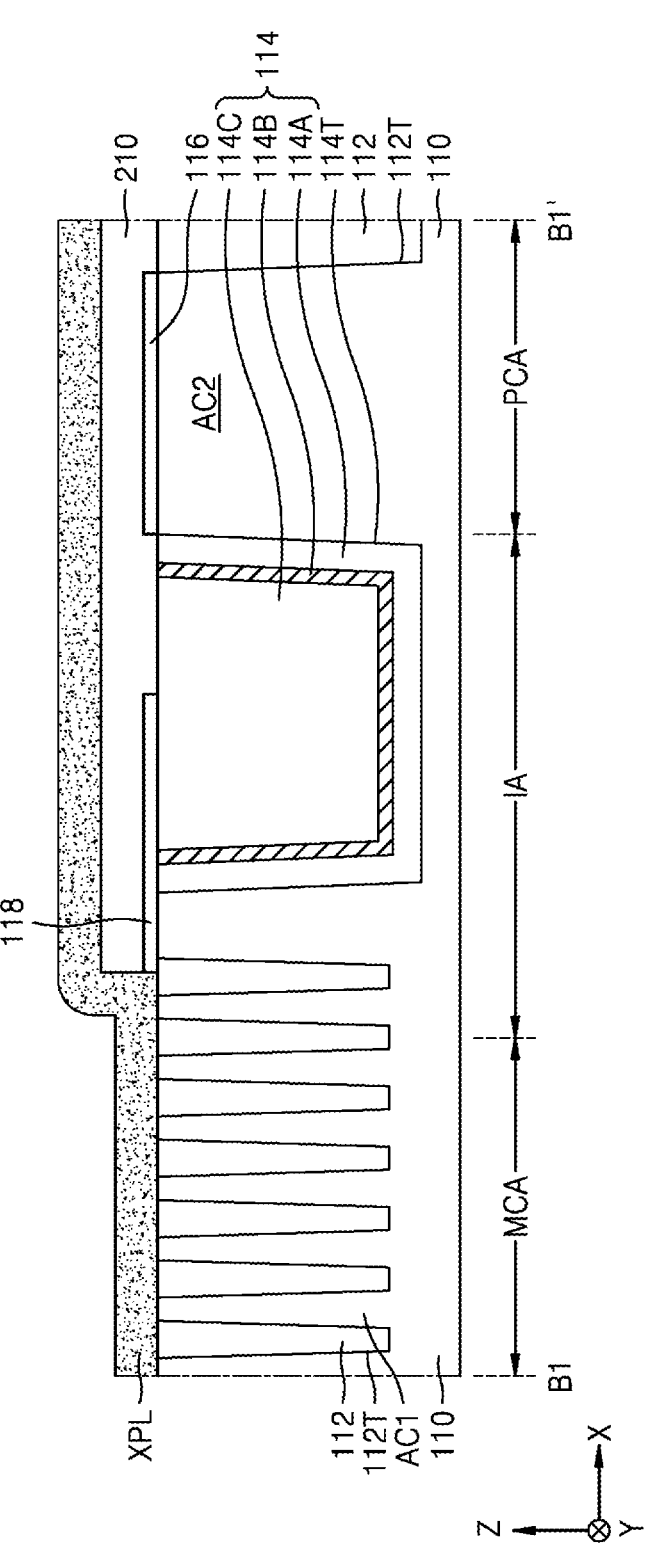
Figure 9B:
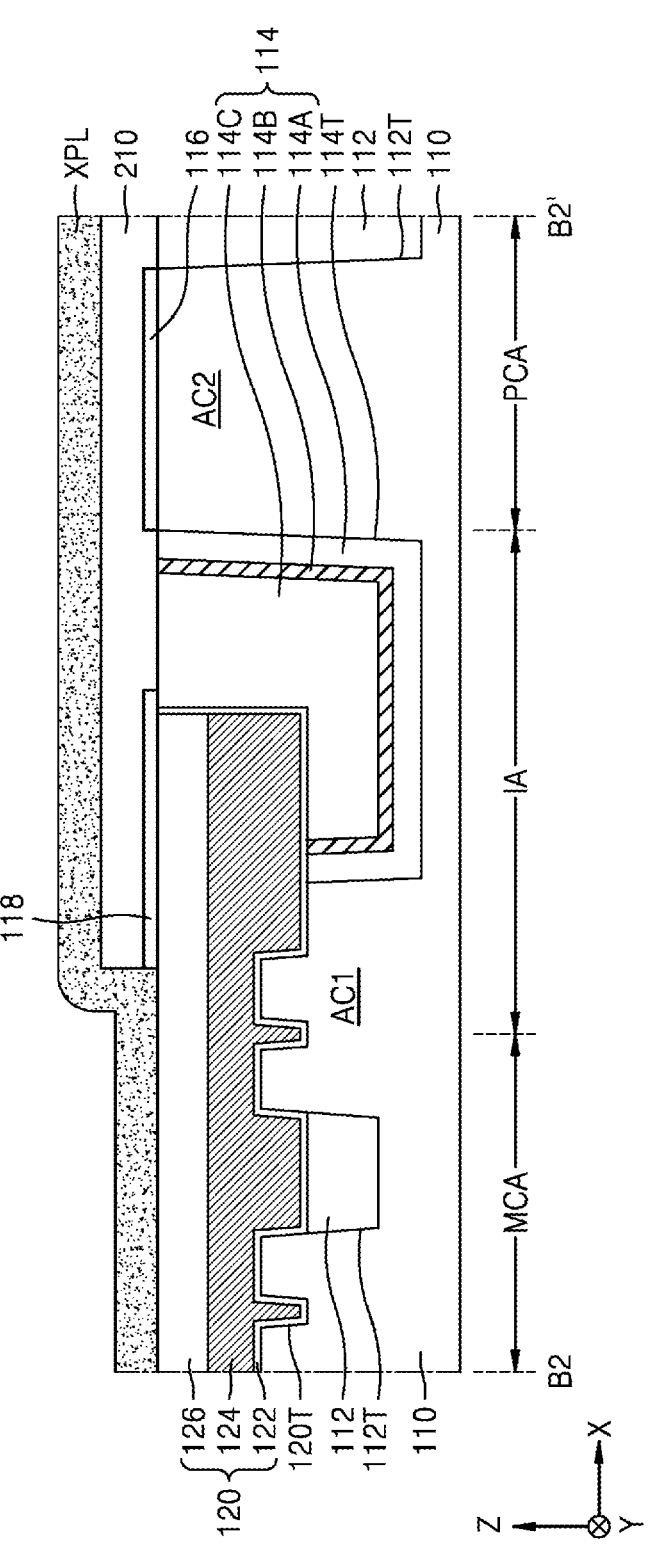

Referring to FIGS. 9A and 9B, the protective layer 210 may be formed on the buffer layer 118 in the interface area IA and on the gate dielectric layer 116 and the device isolation layer 112 in the peripheral circuit area PCA. For example, the protective layer 210 may be formed using silicon oxide.

Thereafter, a conductive layer XPL may be formed on the substrate 110 in the cell array area MCA and on the protective layer 210 in the peripheral circuit area PCA. In some embodiments, the conductive layer XPL may include Si, Ge, W, WN, Co, Ni, Al, Mo, Ru, Ti, TiN, Ta, TaN, Cu, or combinations thereof. For example, the conductive layer XPL may be formed using polysilicon.

Figure 10A:
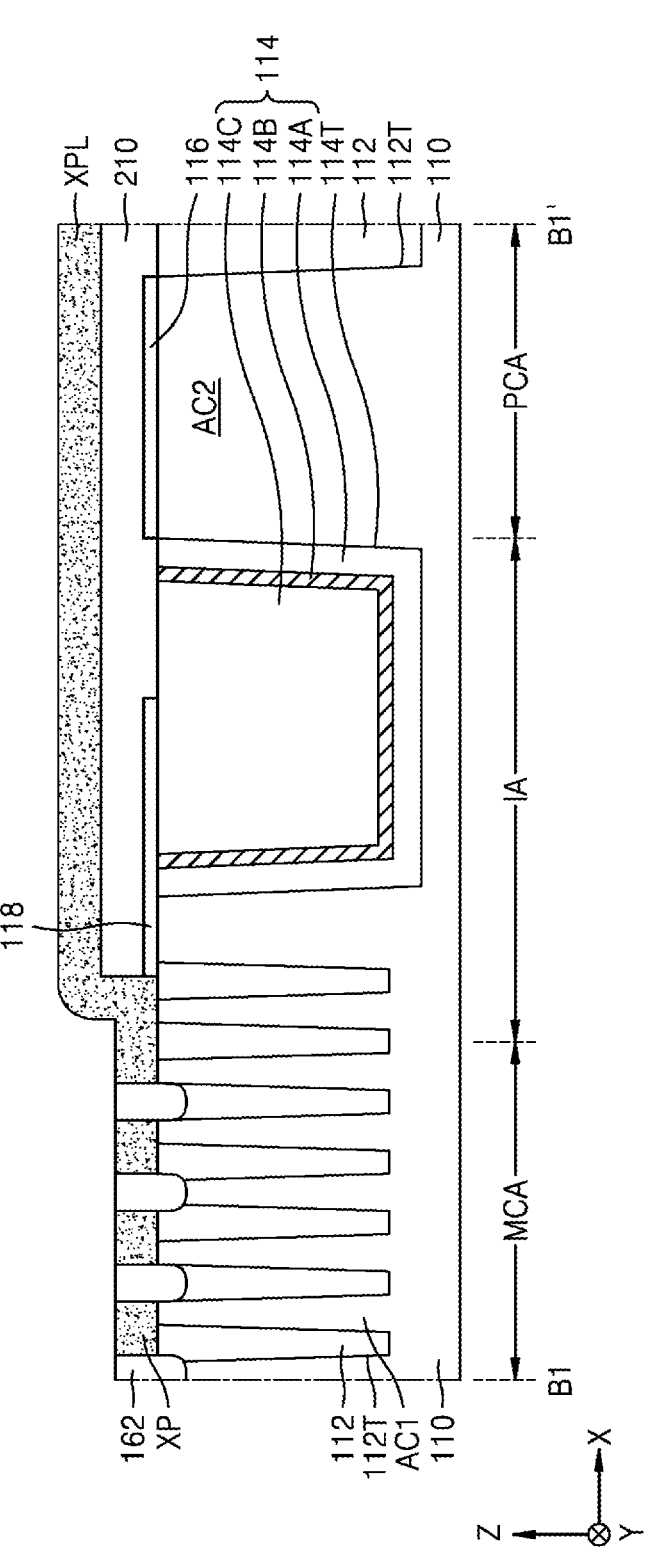
Figure 10B:
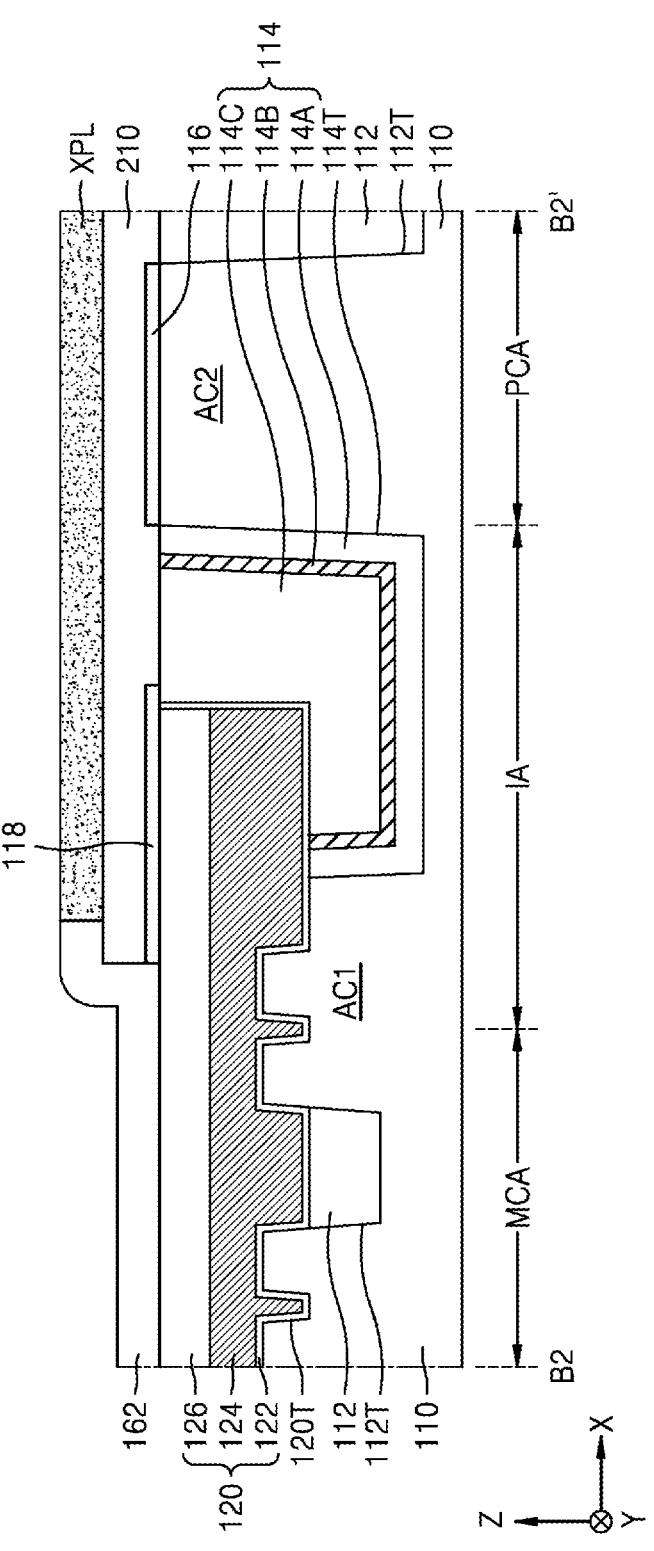

Referring to FIGS. 10A and 10B, a mask pattern (not shown) may be formed on the conductive layer XPL, a plurality of cell pads XP may be formed by patterning the conductive layer XPL in the cell array area MCA using the mask pattern as an etch mask, and the insulating pattern 162 in a space between the cell pads XP may be formed.

In some embodiments, the insulating pattern 162 may include a first line pattern (not shown) that extends in the first horizontal direction X and a second line pattern (not shown) intersecting with the first line pattern between two adjacent first line patterns. In some embodiments, the cell pads XP may be separated from each other by the insulating pattern 162 and may have a matrix arrangement in which the plurality of cell pads XP are spaced apart from each other in the first horizontal direction X and the second horizontal direction Y.

Meanwhile, the conductive layer XPL on the interface area IA and the peripheral circuit area PCA may remain while covering the buffer layer 118 and the protective layer 210.

Figure 11:
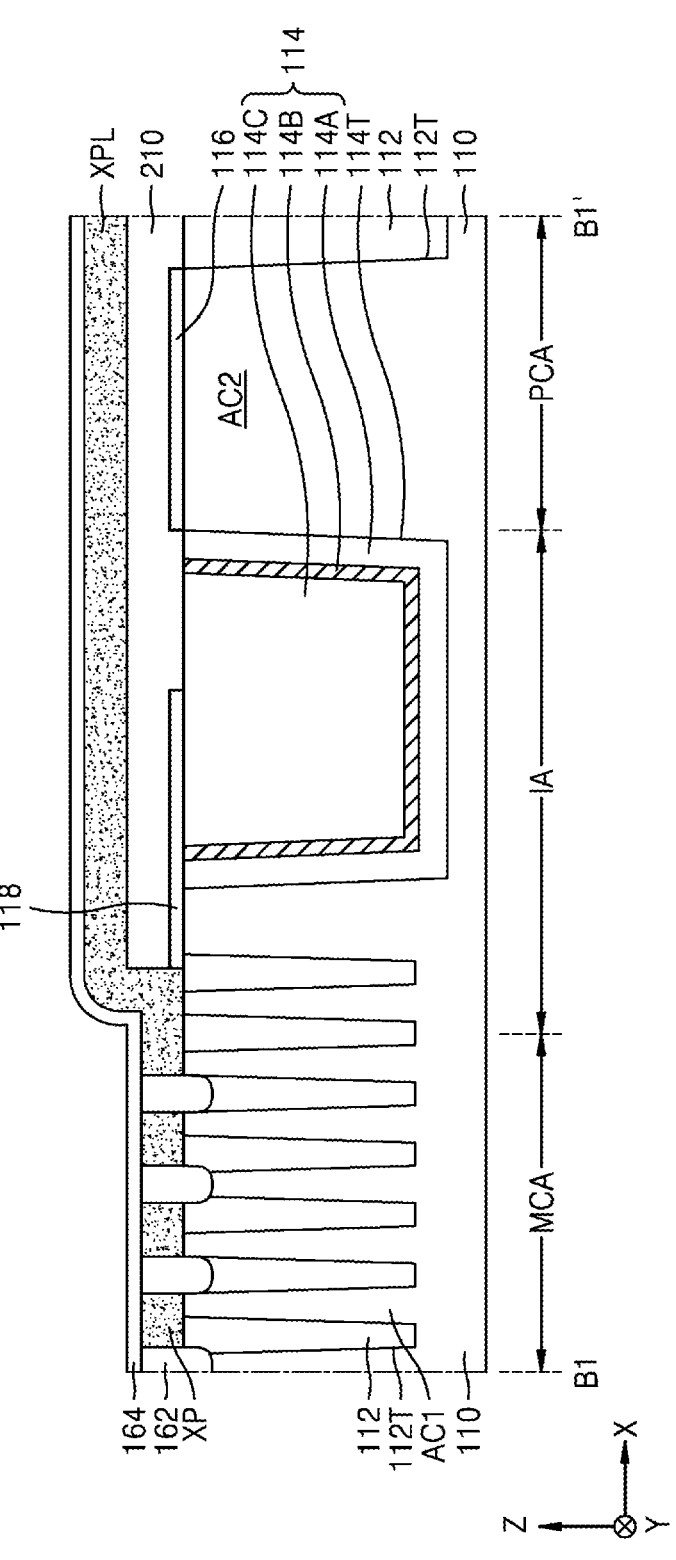

Referring to FIG. 11, an insulating layer 164 may be formed on upper surfaces of the cell pads XP and the insulating pattern 162. The insulating layer 164 may be formed using silicon nitride. The insulating layer 164 may also cover an upper surface of the conductive layer XPL on the interface area IA and the peripheral circuit area PCA.

Figure 12:
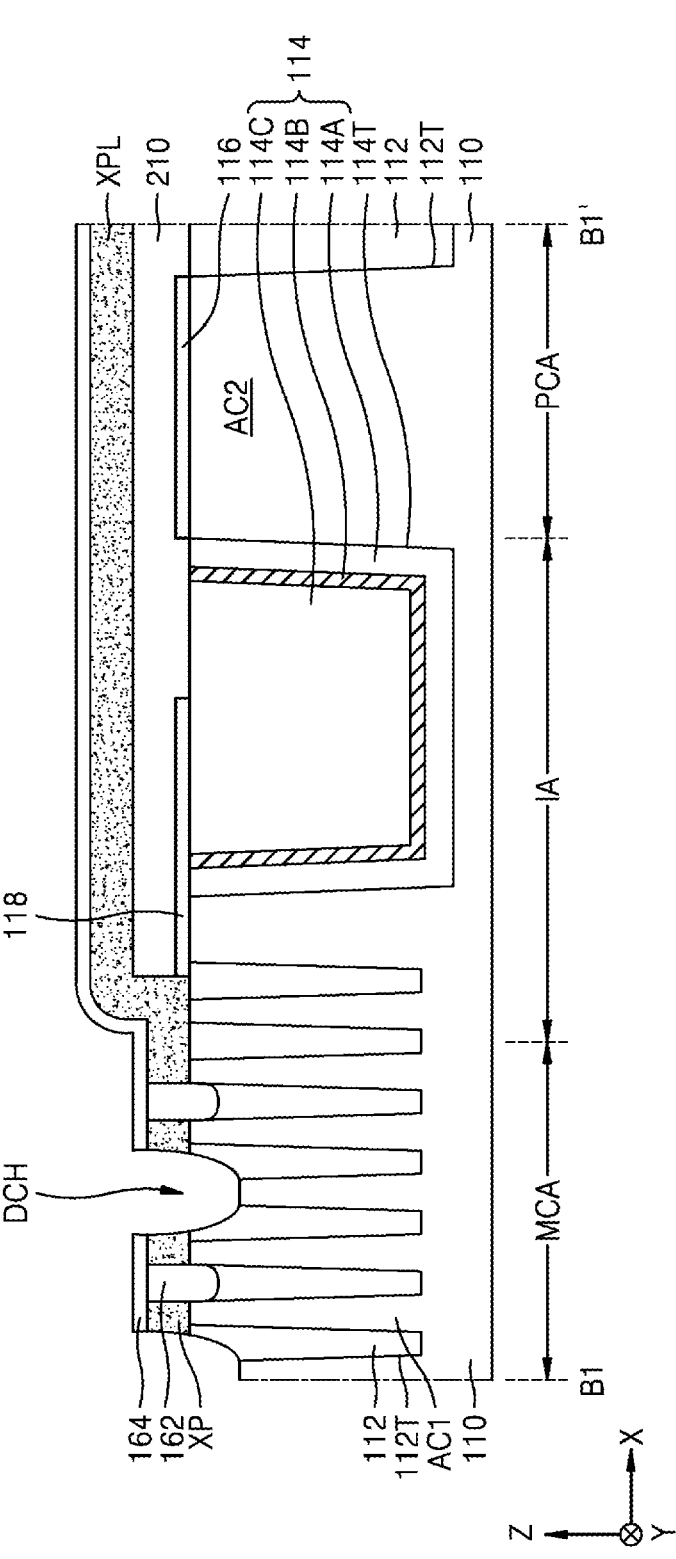

Referring to FIG. 12, a mask pattern (not shown) may be formed on the insulating layer 164, and the first active region AC1 of the substrate 110 may be exposed again by removing some of the cell pads XP. Thereafter, an exposed upper portion of the substrate 110 may be further removed to form the direct contact hole DCH.

Figure 13A:
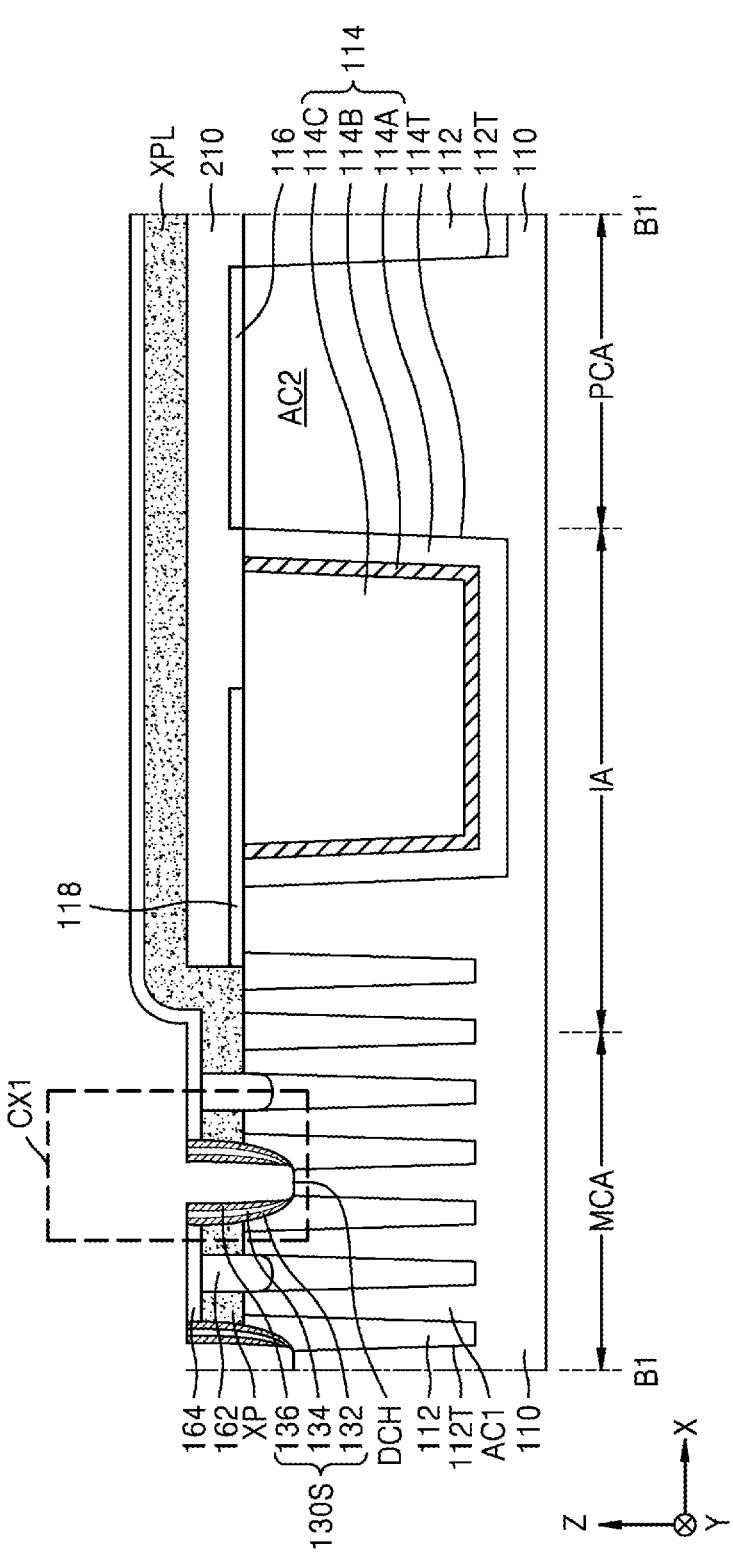
Figure 13B:
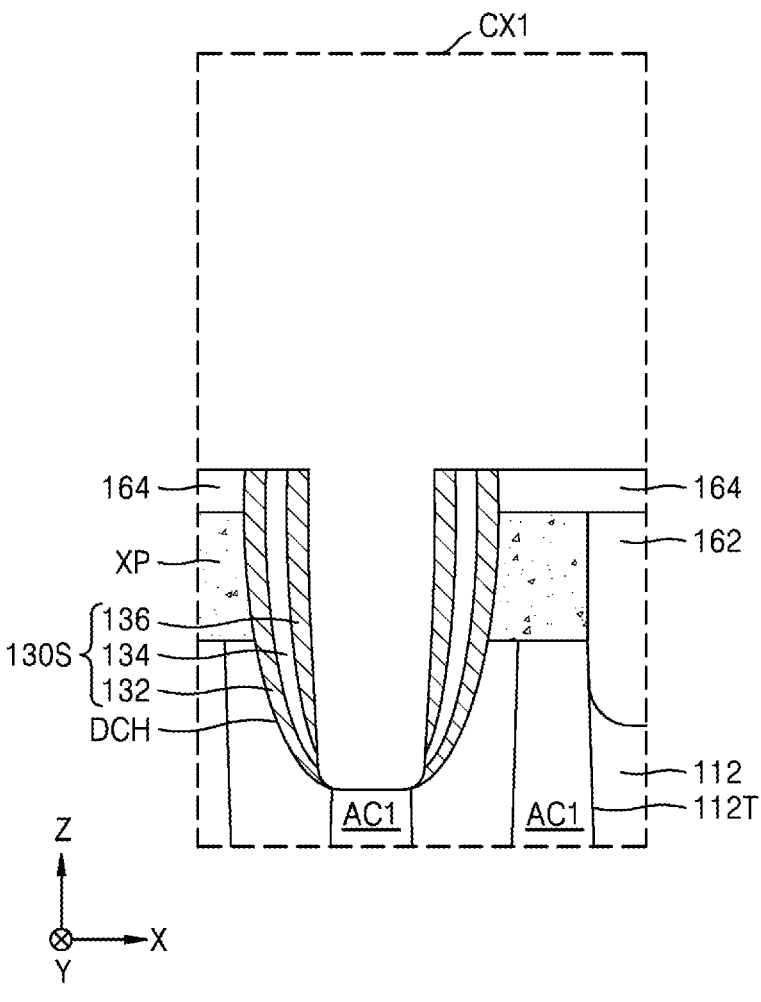

Referring to FIGS. 13A and 13B, a sacrificial liner structure 130S may be formed on the inner wall of the direct contact hole DCH. In some embodiments, the first liner 132, the sacrificial layer 134, and the second liner 136 may be sequentially formed, and an etch-back process may be performed to expose a bottom portion of the direct contact hole DCH again, thereby forming the sacrificial liner structure 130S on the sidewall of the direct contact hole DCH. In other embodiments, after the process of forming the sacrificial layer 134, an etch-back process for exposing the bottom portion of the direct contact hole DCH may be performed, and then the second liner 136 may be formed to cover the sacrificial layer 134.

In some embodiments, the sacrificial layer 134 may be formed using a material having etch selectivity with respect to the first and second liners 132 and 136. In some embodiments, the sacrificial layer 134 may include a material removable by a wet etching process or a dry etching process while the first and second liners 132 and 136 remain and are not removed. In some embodiments, the sacrificial layer 134 may include a material removable by a wet cleaning process or a dry cleaning process while the first and second liners 132 and 136 remain and are not removed.

In some embodiments, the first liner 132 may be formed using silicon nitride or silicon oxynitride, the sacrificial layer 134 may be formed using silicon oxide, and the second liner 136 may be formed using silicon oxide or silicon oxynitride.

Figure 14:
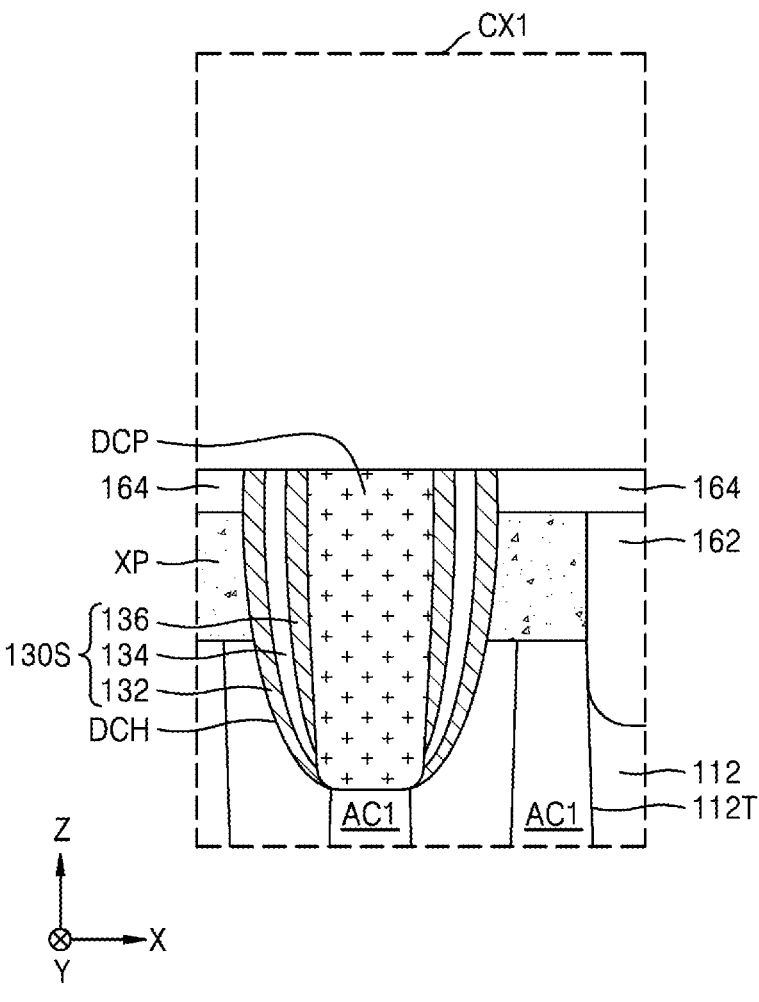

Referring to FIG. 14, a conductive layer (not shown) may be formed inside the direct contact hole DCH, and an upper portion of the conductive layer may be etched back so that the upper surface of the insulating layer 164 is exposed to form the preliminary direct contact DCP inside the direct contact hole DCH.

In some embodiments, the preliminary direct contact DCP may be surrounded by the sacrificial liner structure 130S inside the direct contact hole DCH, and the preliminary direct contact DCP may have an upper surface at a vertical level that is the same as that of the upper surface of the insulating layer 164.

In the etch-back process of forming the preliminary direct contact DCP, an upper portion of the sacrificial liner structure 130S may be removed to expose an upper surface of the sacrificial layer 134 to the outside. In other words, the sacrificial layer 134 may be upwardly exposed.

Figure 15:
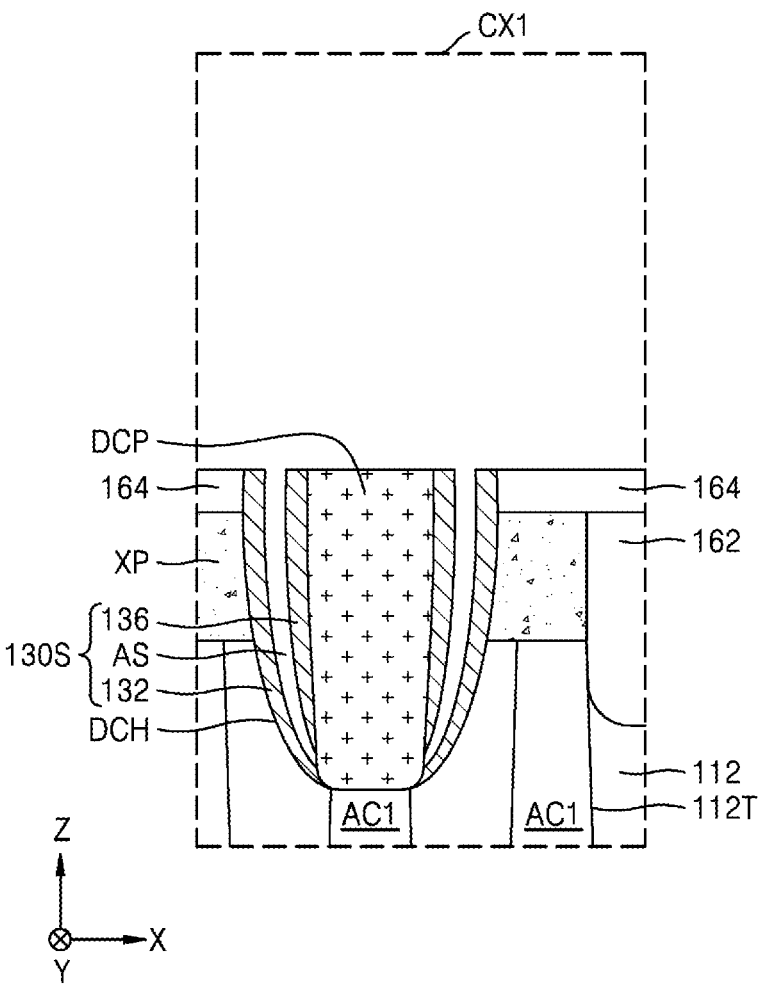

Referring to FIG. 15, the sacrificial layer 134 of the sacrificial liner structure 130S may be removed and the air space AS may be formed. In embodiments, the process of removing the sacrificial layer 134 may be a wet cleaning process or a dry cleaning process, and while the sacrificial layer 134 is being removed, the first liner 132 and the second liner 136 may not be removed and may remain on the inner wall of the direct contact hole DCH. Accordingly, the air space AS may be formed between the first liner 132 and the second liner 136, and the air space AS may surround a sidewall of the preliminary direct contact DCP.

Figure 16:
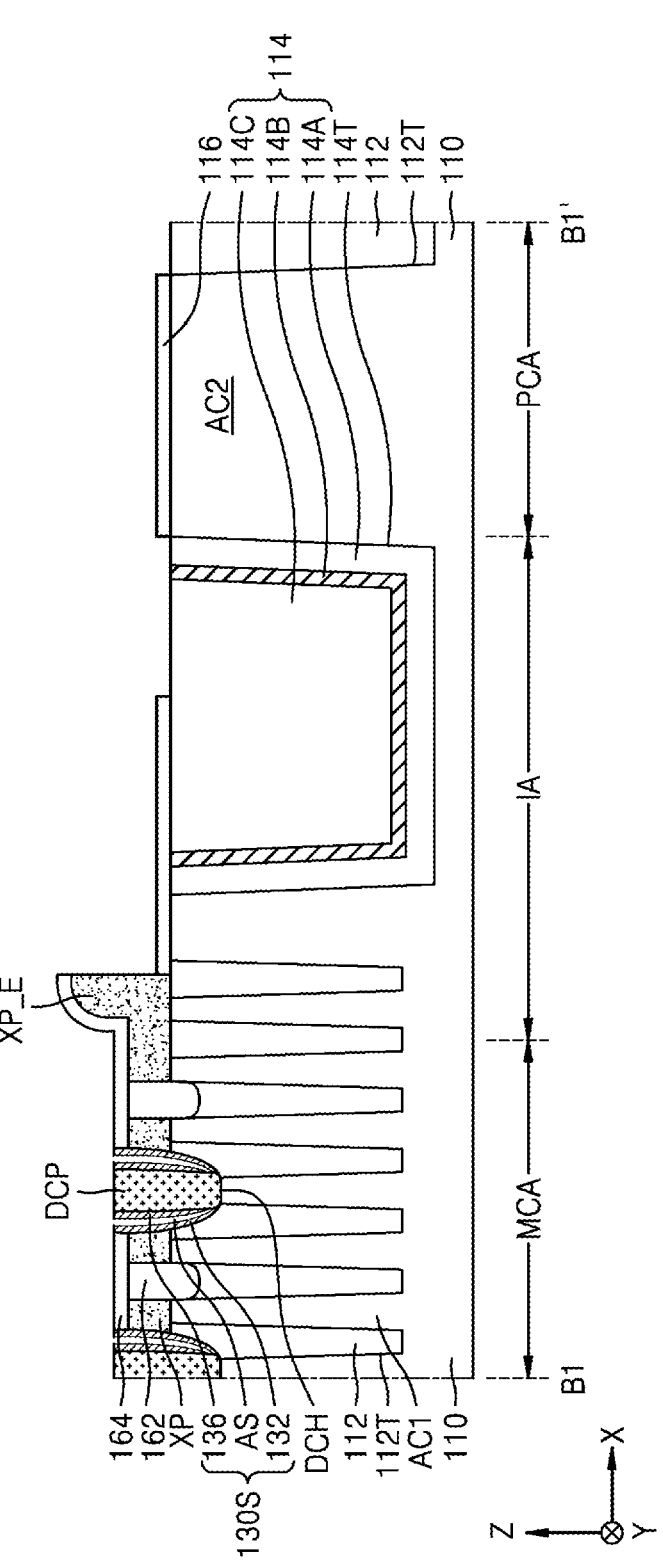

Referring to FIG. 16, the conductive layer XPL and the protective layer 210 may be removed on the interface area IA and the peripheral circuit area PCA, and the upper surfaces of the buffer layer 118 and the gate dielectric layer 116 may be exposed again. In this case, a portion of the conductive layer XPL remaining on a portion of the interface area IA may be referred to as a cell pad extension XP_E.

Figure 17A:
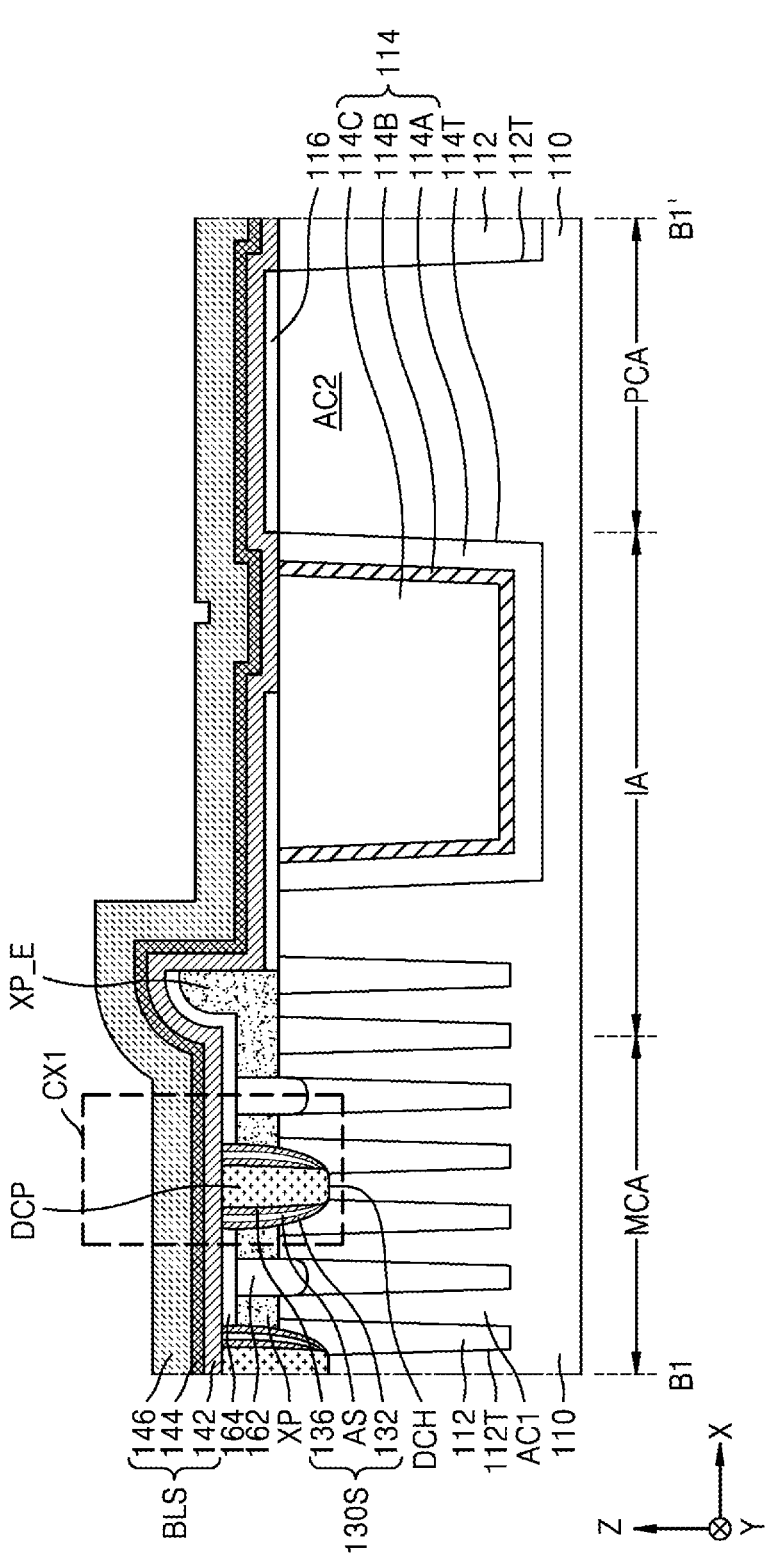
Figure 17B:
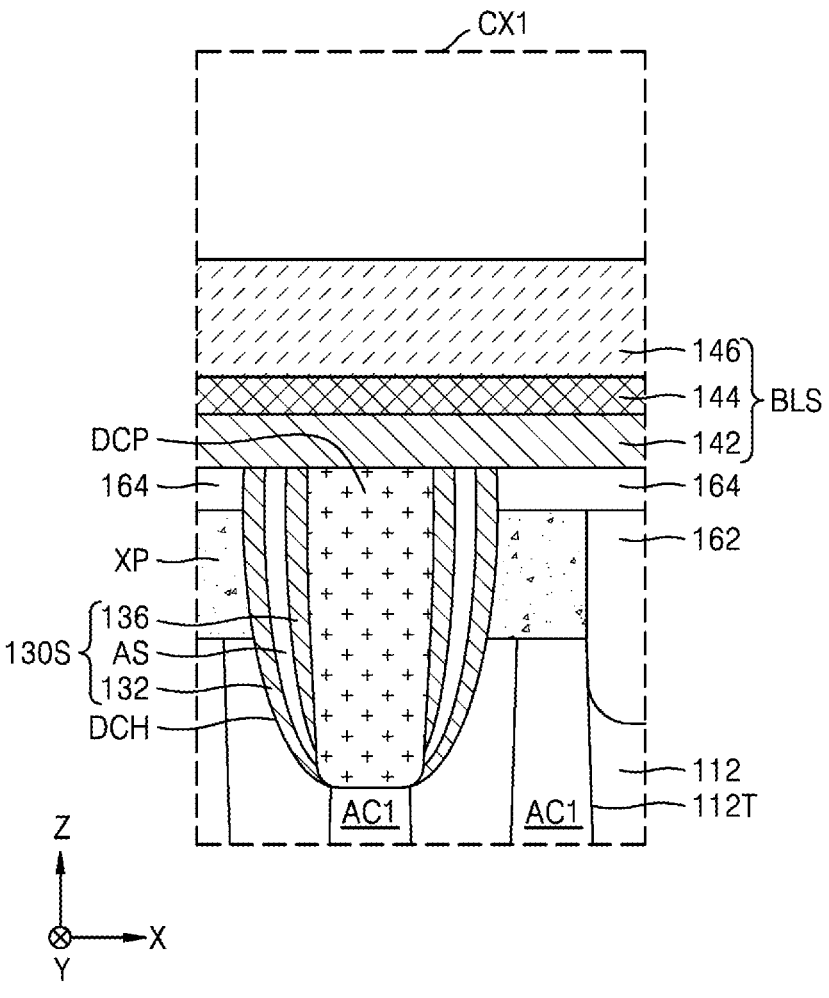

Referring to FIGS. 17A and 17B, the bit line stack BLS may be formed on the preliminary direct contact DCP and the insulating layer 164 in the cell array area MCA and on the gate dielectric layer 116 in the peripheral circuit area PCA.

In some embodiments, the bit line stack BLS may be formed by sequentially forming the first conductive layer 142, the second conductive layer 144, and the third conductive layer 146.

In embodiments, in the process of forming the first conductive layer 142, the first conductive layer 142 may be formed to cover the upper side of the air space AS and the preliminary direct contact DCP so that the air space AS remains in the direct contact hole DCH. For example, in the process of forming the first conductive layer 142, the step coverage of the first conductive layer 142 may not be excellent (e.g., may be poor), and accordingly, the first conductive layer 142 may be formed such that the air space AS is not filled and an inlet of the air space AS is closed.

Figure 18A:
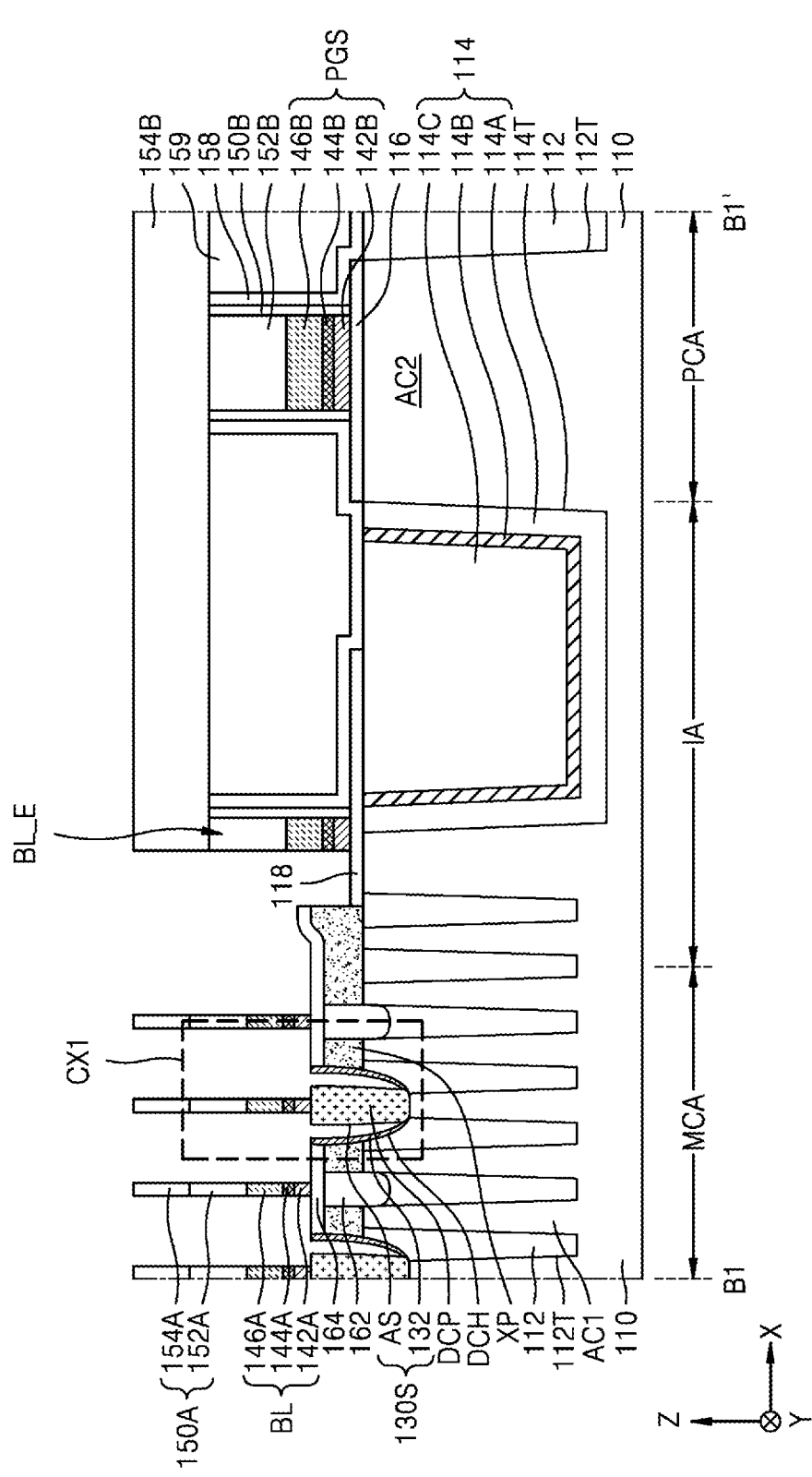
Figure 18B:
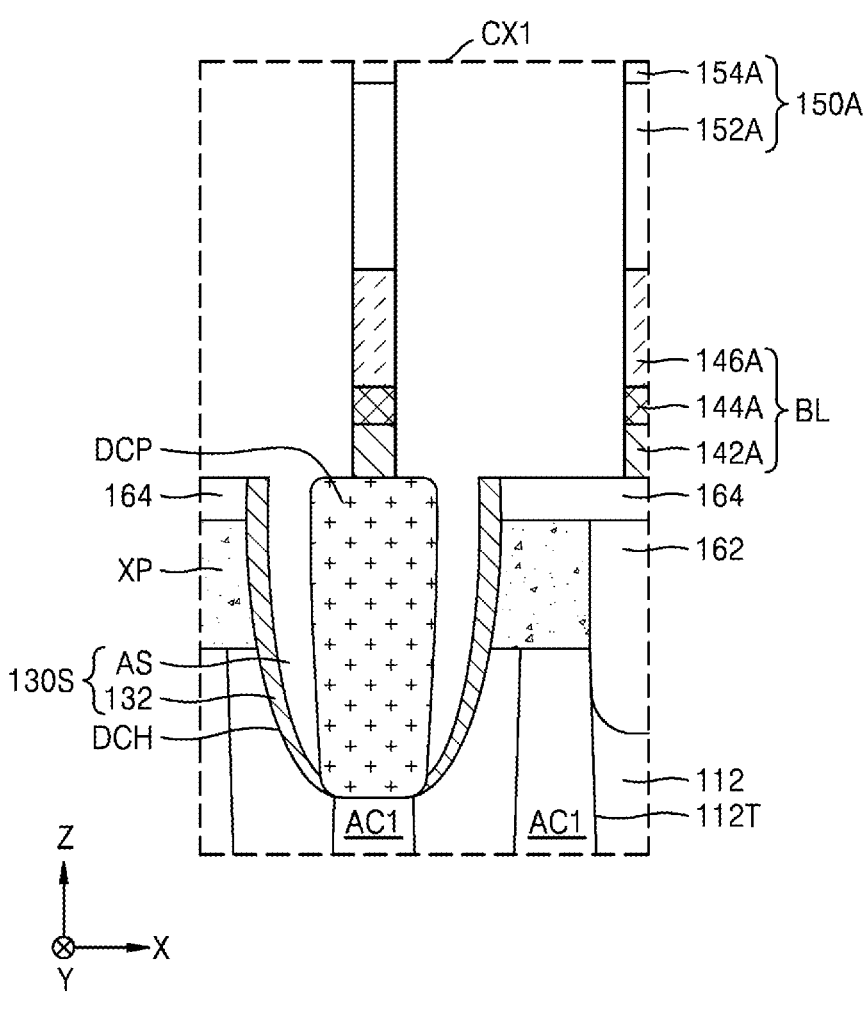

Referring to FIGS. 18A and 18B, a lower insulating capping layer (not shown) may be formed on the bit line stack BLS. A mask pattern (not shown) may be formed on the lower insulating capping layer, and the lower insulating capping layer and the bit line stack BLS in the peripheral circuit area PCA may be patterned using the mask pattern to form the gate capping pattern 152B and the peripheral circuit gate electrode PGS.

In some embodiments, the peripheral circuit gate electrode PGS may include a first conductive layer 142B, a second conductive layer 144B, and a third conductive layer 146B sequentially provided on the gate dielectric layer 116.

Thereafter, the insulating spacer 150B covering the sidewall of the peripheral circuit gate electrode PGS may be formed. The insulating spacer 150B may be formed using silicon nitride.

Thereafter, the protective layer 158 covering the gate capping pattern 152B and the sidewall of the peripheral circuit gate electrode PGS may be formed in the peripheral circuit area PCA. An insulating layer (not shown) may be formed on the protective layer 158 to completely cover the gate capping pattern 152B and the peripheral circuit gate electrode PGS, and an upper portion of the insulating layer may be planarized so that the upper surface of the gate capping pattern 152B is exposed, to form the first interlayer insulating layer 159.

Thereafter, the upper insulating capping layer 154B may be formed on the lower insulating capping layer in the cell array area MCA and on the first interlayer insulating layer 159 in the peripheral circuit area PCA, and the upper insulating capping layer 154B, the lower insulating capping layer, and the bit line stack BLS in the cell array area MCA may be patterned to form the insulating capping structures 150A and the bit lines BL. For example, each of the insulating capping structures 150A may include the upper capping pattern 154A formed by patterning the upper insulating capping layer 154B and the lower capping pattern 152A formed by patterning the lower insulating capping layer.

Figure 19:
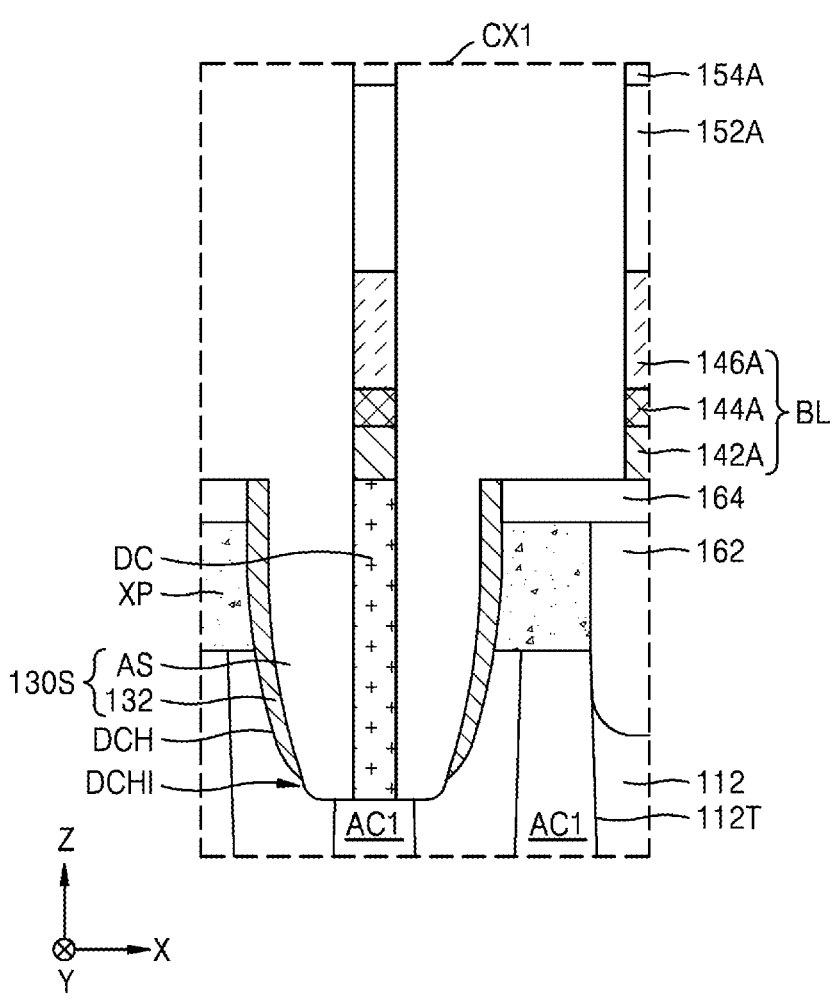

Referring to FIG. 19, a side portion of the preliminary direct contact DCP inside the direct contact hole DCH may be patterned to form the direct contact DC.

In some embodiments, the forming of the bit lines BL and the forming of the direct contact DC may be performed in the same chamber using the same etching conditions. In other embodiments, the forming of the direct contact DC may be performed after forming the bit lines BL, but before forming the direct contact DC, a portion of the side of the preliminary direct contact DCP may be patterned to form the direct contact DC, without forming an additional spacer on the sidewall of the bit lines BL.

In some embodiments, in the process of forming the bit lines BL, a side portion of the preliminary direct contact DCP inside the direct contact hole DCH may be patterned to form the direct contact DC.

For example, the air space AS of the sacrificial liner structure 130S surrounding the periphery of the preliminary direct contact DCP may act as a supply path via which an etching gas is supplied, and accordingly, lateral etching may take place in a lateral direction of the preliminary direct contact DCP.

In general, a process for patterning the bit line BL may be first performed, and after the bit line BL is patterned, the preliminary direct contact DCP may be patterned; however, in this case, the direct contact DC may have a non-vertical sidewall profile because an etch gas supply path is very narrow. For example, the upper portion of the direct contact DC may be more exposed to an etch atmosphere than the bottom portion of the direct contact DC, and accordingly, a relatively narrow neck region or an undercut region may be formed on the upper sidewall of the direct contact DC, while a tail portion extending outwardly from the bottom portion of the direct contact DC may be formed. Bridge defects may occur in a subsequent process due to the non-vertical sidewall profile of the direct contact DC. Alternatively, after an additional spacer is formed on the sidewall of the bit line BL, the direct contact DC may be patterned but the process of forming and removing the additional spacer may be complicated.

However, according to some embodiments of the present disclosure, because the process for patterning the bit line BL and the direct contact DC is performed when the air space AS is already formed inside the direct contact hole DCH, an etching gas may be sufficiently supplied into the direct contact hole DCH through the air space AS. Accordingly, the preliminary direct contact DC may be laterally etched through the direct contact hole DCH, and the direct contact DC may have a vertical or straight sidewall profile. For example, the direct contact DC may have a uniform width in the entire height thereof and may have a rectangular vertical cross-section.

In the process of forming the direct contact DC, a portion of the first liner 132 may remain on the inner wall of the direct contact hole DCH and a portion of the bottom portion of the direct contact hole DCH not covered by the first liner 132 may be further etched downwardly to form the inflection portion DCHI.

Figure 20A:
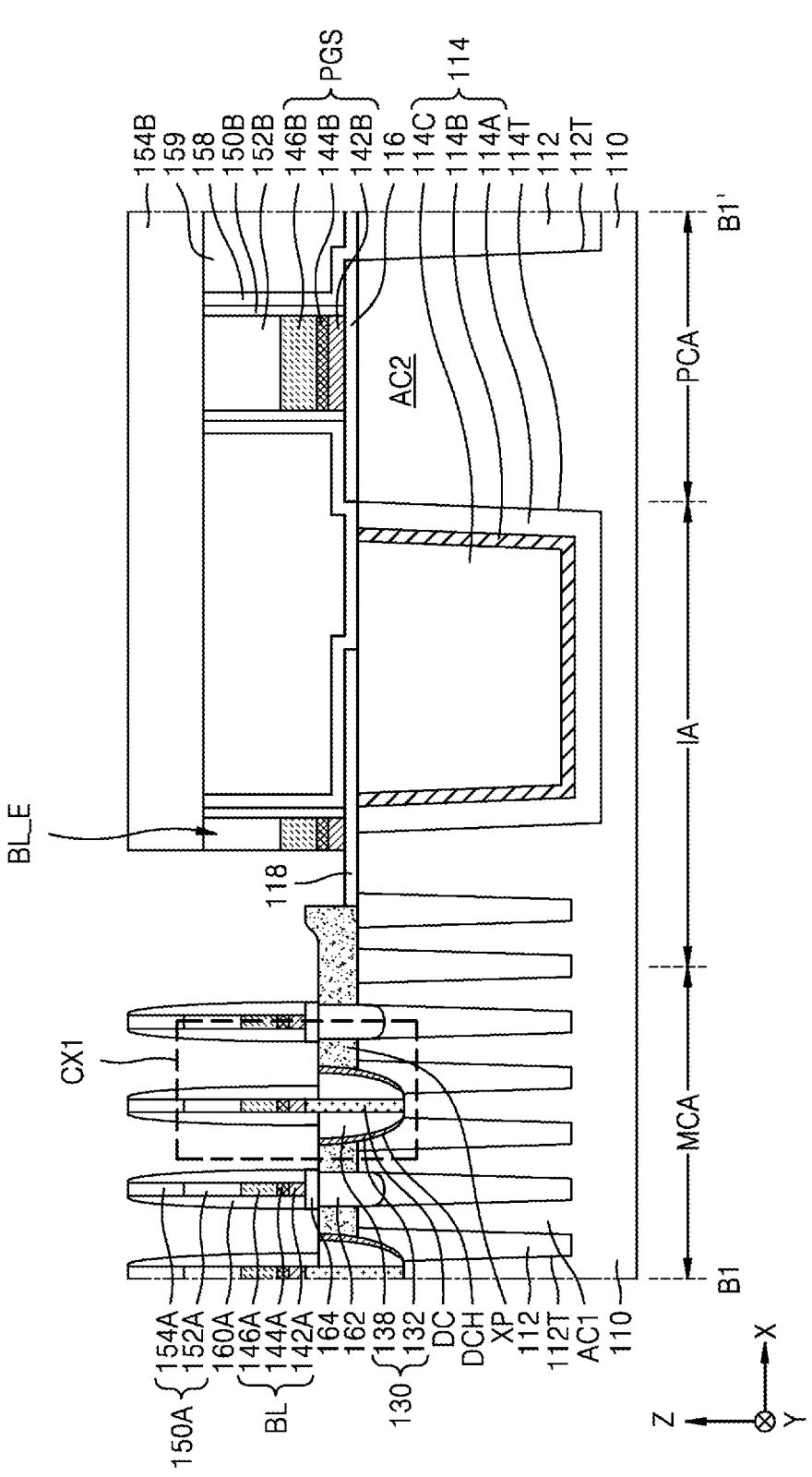
Figure 20B:
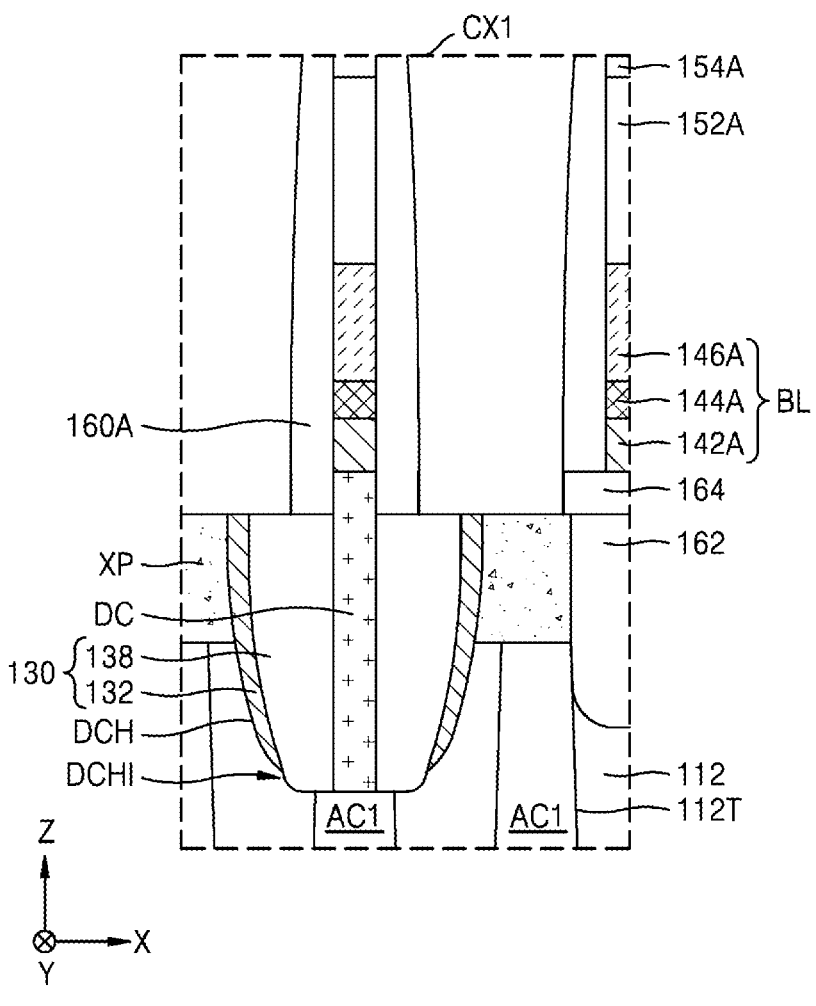

Referring to FIGS. 20A and 20B, an insulating spacer 138 in the inside of the direct contact hole DCH may be formed. For example, an insulating layer (not shown) may be formed to have a sufficient thickness to surround the sidewall of the direct contact DC and fill the inside of the direct contact hole DCH, and an upper portion of the insulating layer may be etched back so that the insulating layer remains inside the direct contact hole DCH, to form the insulating spacer 138.

Thereafter, the bit line spacer 160A may be formed on the sidewall of the bit line BL, and a plurality of insulating fences 166 may be formed between the bit lines BL, respectively.

Figure 21:
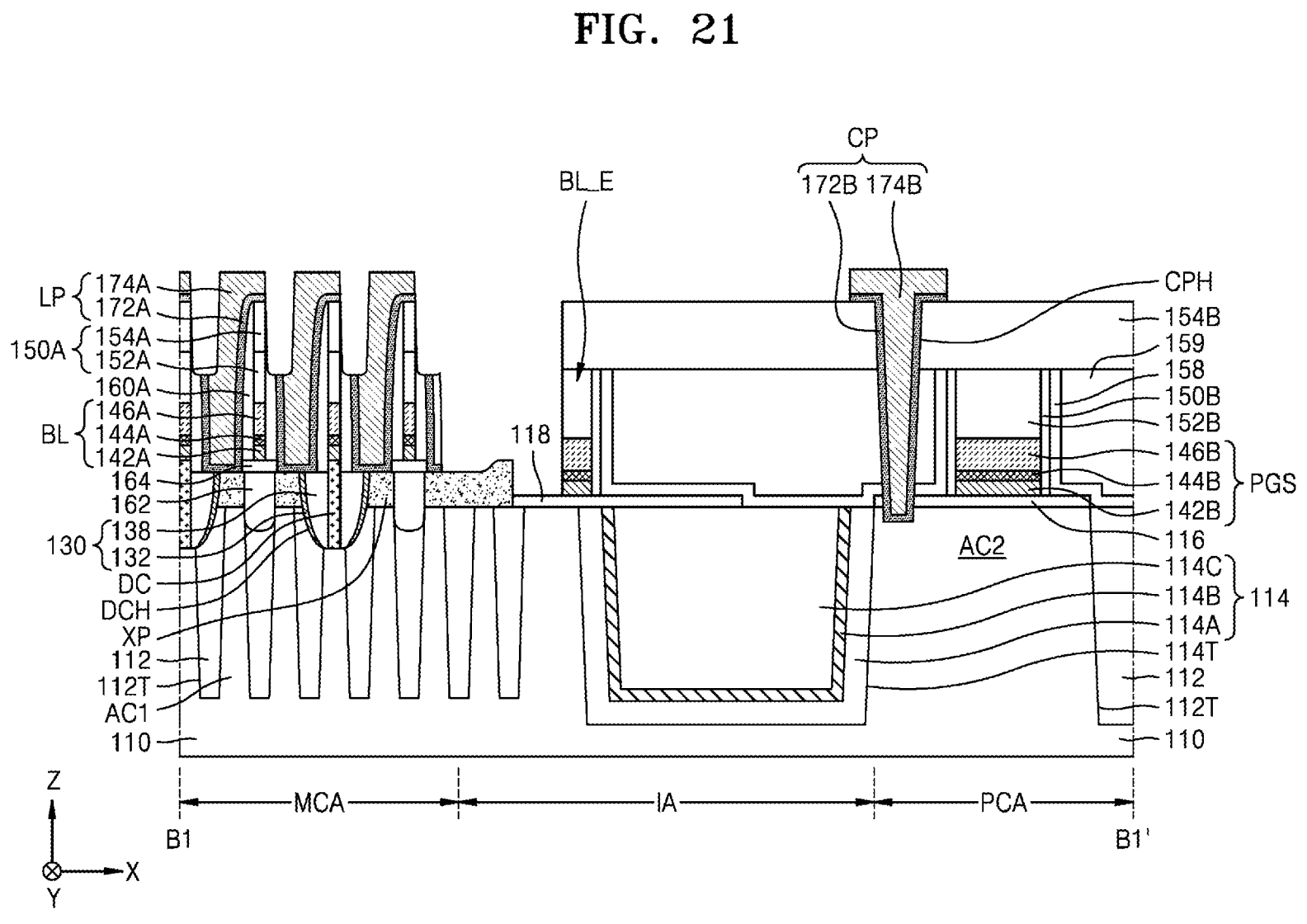

Referring to FIG. 21, the contact holes CPH that expose the second active region AC2 of the substrate 110 may be formed by etching the upper insulating capping layer and the first interlayer insulating layer 159 in the peripheral circuit area PCA. Thereafter, the insulating layer 164 exposed between the bit lines BL is removed in the cell array area MCA to expose the upper surface of the cell pad XP.

Thereafter, a conductive barrier layer (not shown) and a conductive layer (not shown) that cover the exposed surface of the substrate 110 in the cell array area MCA and the peripheral circuit area PCA are formed. The landing pads LP including the conductive barrier layer 172A and the landing pad conductive layer 174A may be formed in the cell array area MCA by patterning the conductive barrier layer and the conductive layer, and the contact plugs CP including the conductive barrier layer 172B and the landing pad conductive layer 174B are formed in the peripheral circuit area PCA.

Figure 22:
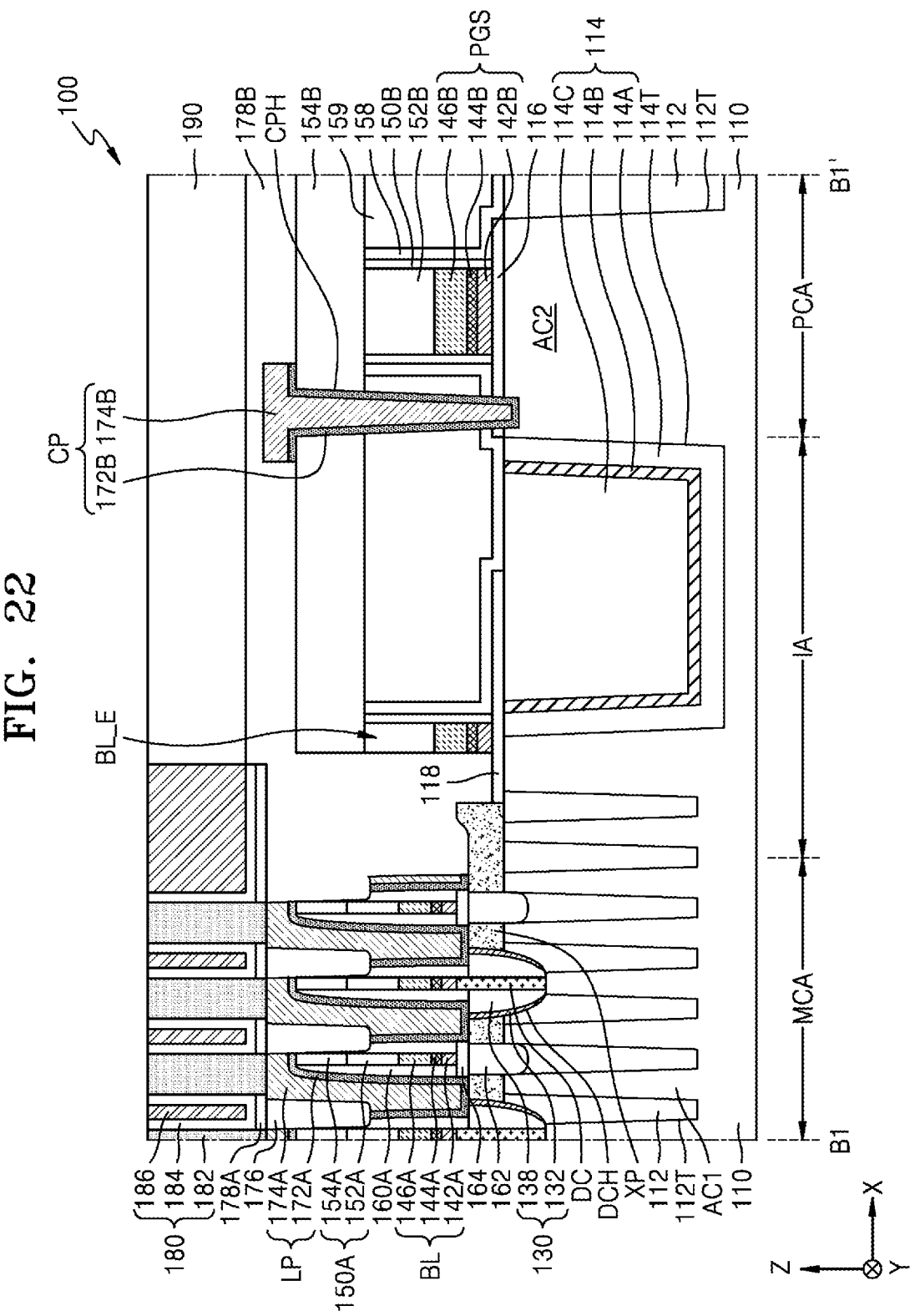

Referring to FIG. 22, the insulating pattern 176 covering the landing pads LP is formed in the cell array area MCA, and the second etch stop layer 178B covering the contact plugs CP may be formed in the peripheral circuit area PCA. Thereafter, the first etch stop layer 178A may be formed on the cell array area MCA.

The lower electrodes 182 connected to the landing pad LP may be formed through the first etch stop layer 178A, and the capacitor dielectric layer 184 and the upper electrode 186 may be sequentially formed.

Thereafter, the second interlayer insulating layer 190 that covers the upper electrode 186 may be formed on the cell array area MCA and the peripheral circuit area PCA.

The semiconductor device 100 may be completed by performing the method described above.

According to the manufacturing method according to some example embodiments, the process of forming the bit line BL and the process of forming the direct contact DC may be performed in one process, and in particular, because the etching gas may be sufficiently supplied through the air space AS when forming the direct contact DC, the sidewall of the direct contact DC may have a vertical profile.

Figure 23:
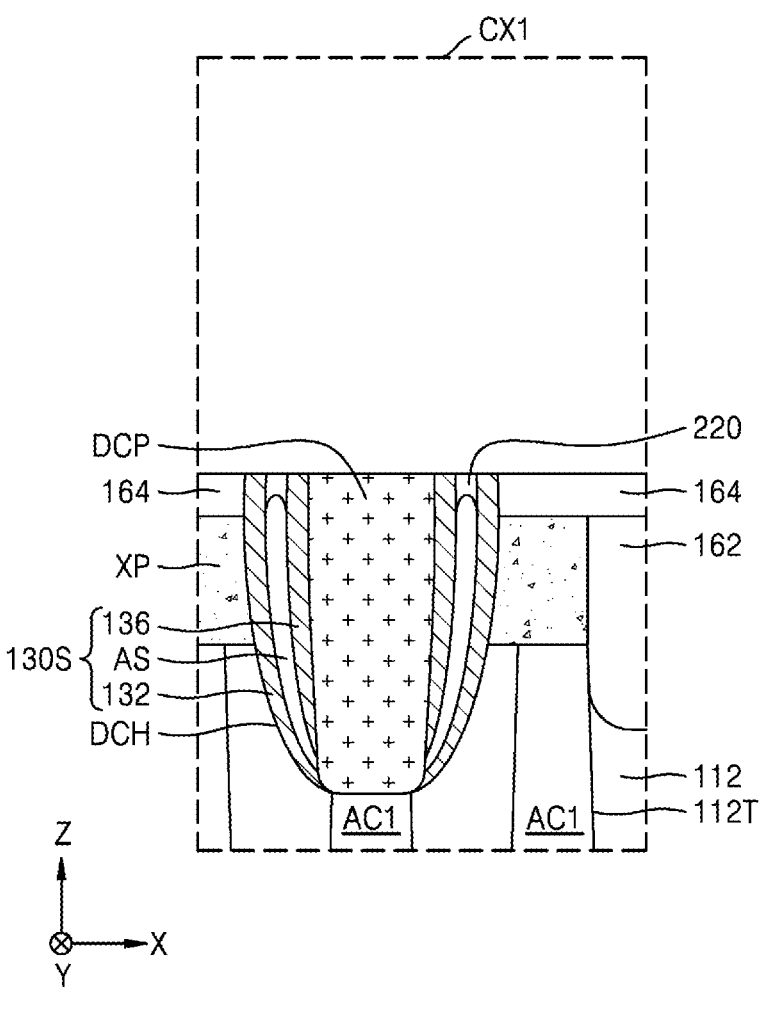
FIGS. 23 and 24 are cross-sectional views illustrating a method of manufacturing a semiconductor device, according to some embodiments.
Figure 24:
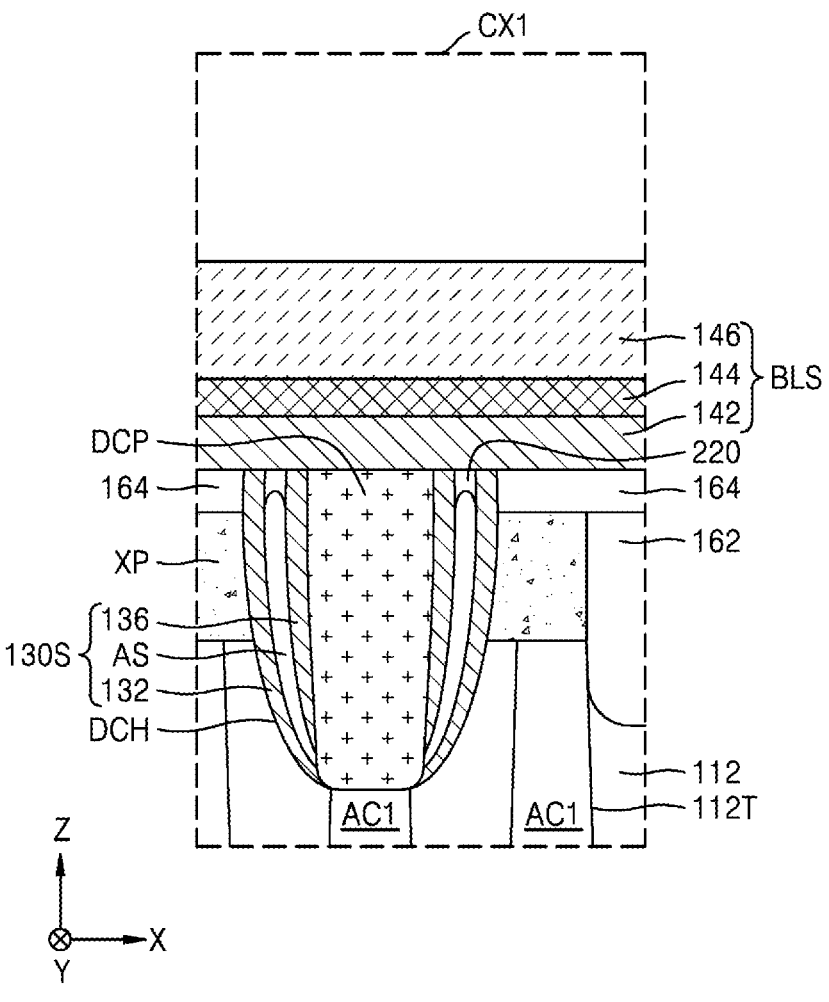

FIGS. 23 and 24 are cross-sectional views illustrating a manufacturing method according to some embodiments.

First, the process described above with reference to FIGS. 6A to 15 may be performed to form a structure in which the sacrificial layer 134 is removed and the air space AS is formed.

Thereafter, referring to FIG. 23, the cover insulating layer 220 that blocks an upper portion of the air space AS may be formed. The cover insulating layer 220 may be formed using silicon nitride, silicon oxynitride, or silicon oxide, and may be formed using, for example, a material having poor step coverage. The cover insulating layer 220 may block the upper portion of the air space AS so that the air space AS remains between the first liner 132 and the second liner 136.

Referring to FIG. 24, the bit line stack BLS blocking an upper portion of the cover insulating layer 220 may be formed.

Thereafter, the semiconductor device 100 may be completed by performing the processes described above with reference to FIGS. 18A to 22. This may include removing the cover insulating layer 220 during a portion of the process, thereby upwardly exposing the air space AS.

While the inventive concepts have been particularly shown and described with reference to examples of embodiments thereof, it will be understood that various changes in form and details may be made therein without departing from the scope of the following claims.

What is claimed is:

1. A method of manufacturing a semiconductor device, the method comprising:
   forming a plurality of word lines in a plurality of word line trenches that extend in a first horizontal direction on a substrate;
   removing a portion of the substrate located between adjacent ones of the plurality of word lines to form a direct contact hole;
   forming, on an inner wall of the direct contact hole, a sacrificial liner structure including a first liner, a sacrificial layer, and a second liner;
   forming a preliminary direct contact in the direct contact hole on the sacrificial liner structure;
   removing the sacrificial layer, while leaving the first liner and the second liner, to form an air space between the first liner and the second liner;
   forming a bit line stack that covers an upper surface of the air space on the preliminary direct contact;
   patterning the bit line stack to form a plurality of bit lines that extend in a second horizontal direction that crosses the first horizontal direction; and
   removing side portions of the second liner and the preliminary direct contact in the direct contact hole to form a direct contact; and
   forming an insulating spacer on the inner wall of the direct contact hole to cover a side wall of the direct contact.

2. The method of claim 1, wherein the forming of the bit line stack comprises:
   forming a first conductive layer that covers the air space on the preliminary direct contact;
   forming a second conductive layer on the first conductive layer; and
   forming a third conductive layer on the second conductive layer.

3. The method of claim 2, wherein:
   the first conductive layer includes a material that comprises polysilicon,
   the second conductive layer comprises at least one of titanium silicide, titanium silicon nitride, tantalum silicide, tantalum silicon nitride, tungsten silicide, and/or cobalt silicide, and
   the third conductive layer comprises at least one of tungsten, ruthenium, cobalt, tungsten nitride, and/or ruthenium nitride.

4. The method of claim 2, wherein the forming of the plurality of bit lines comprises:
   forming an insulating capping layer on the bit line stack;
   patterning the insulating capping layer to form a plurality of insulating capping structures; and
   sequentially patterning the third conductive layer, the second conductive layer, and the first conductive layer to form the plurality of bit lines, wherein the plurality of insulating capping structures is used as an etch mask.

5. The method of claim 4, wherein, in the forming of the bit lines, after the third conductive layer is patterned, an additional spacer is not formed and the second conductive layer is patterned.

6. The method of claim 1, wherein the forming of the plurality of bit lines and the forming of the direct contact are performed in a same chamber using same etching conditions.

7. The method of claim 6, wherein, in the forming of the direct contact, an etching gas is introduced through the air space located in the direct contact hole so that the preliminary direct contact is laterally etched.

8. The method of claim 1, wherein, the forming of the direct contact is performed after forming the plurality of bit lines.

9. The method of claim 1, wherein, in the forming of the direct contact, a portion of the first liner remains on the inner wall of the direct contact hole, and a portion of the first liner is apart from a bottom portion of the direct contact.

10. The method of claim 1, wherein the direct contact has a vertical sidewall profile.

11. The method of claim 1, further comprising:
    after the forming of the air space, forming a cover insulating layer that covers an upper portion of the air space, and
    wherein the forming the bit line stack comprises forming the bit line stack on the preliminary direct contact and the cover insulating layer.

12. The method of claim 11, further comprising:
    after the forming of the bit line stack and before the forming of the direct contact,
    removing the cover insulating layer so that the air space is upwardly exposed.

13. The method of claim 12, wherein, in the forming the direct contact, an etching gas is introduced through the air space in the direct contact hole so that the preliminary direct contact is laterally etched.

14. A method of manufacturing a semiconductor device, the method comprising:
    forming an interface structure in an interface area of a substrate;
    forming a plurality of word lines that extend in a first horizontal direction on a cell area of the substrate;
    removing a portion of the substrate located between a pair of the plurality of word lines to form a direct contact hole;
    forming, on an inner wall of the direct contact hole, a sacrificial liner structure including a first liner, a sacrificial layer, and a second liner;
    forming a preliminary direct contact in the direct contact hole on the sacrificial liner structure;
    removing the sacrificial layer, while leaving the first liner and the second liner, to form an air space between the first liner and the second liner;
    forming, on the cell area and on the interface area, a bit line stack that contacts the preliminary direct contact and that covers the air space, the bit line stack including a first conductive layer, a second conductive layer, and a third conductive layer;

patterning the bit line stack to form a plurality of bit lines that extend in a second horizontal direction that crosses the first horizontal direction;

removing side portions of the second liner and the preliminary direct contact in the direct contact hole to form a direct contact; and forming an insulating spacer on the inner wall of the direct contact hole to cover a side wall of the direct contact.

15. The method of claim 14, wherein the forming of the plurality of bit lines comprises:

forming an insulating capping layer on the bit line stack;

patterning the insulating capping layer to form a plurality of insulating capping structures; and sequentially patterning the third conductive layer, the second conductive layer, and the first conductive layer to form the plurality of bit lines, wherein, after the third conductive layer is patterned, an additional spacer is not formed and the second conductive layer is patterned.

16. The method of claim 15, wherein, in the forming of the direct contact, an etching gas is introduced through the air space located in the direct contact hole so that the preliminary direct contact is laterally etched.

17. The method of claim 14, wherein, in the forming of the direct contact, a portion of the first liner remains on the inner wall of the direct contact hole, a portion of the first liner is apart from a bottom portion of the direct contact, and the direct contact has a vertical sidewall profile.

18. The method of claim 14, further comprising:

after the forming of the air space, forming a cover insulating layer to cover an upper portion of the air space, wherein the forming of the bit line stack comprises:

forming the bit line stack on the preliminary direct contact and the cover insulating layer; and after the forming of the bit line stack and before the forming of the direct contact, removing the cover insulating layer so that the air space is upwardly exposed.

19. A method of manufacturing a semiconductor device, the method comprising:

forming an interface structure in an interface area of a substrate;

forming a plurality of word line trenches that extend in a first horizontal direction on a cell area of the substrate;

forming a plurality of word lines in the plurality of word line trenches;

removing a portion of the substrate located between a pair of the plurality of word lines to form a direct contact hole;

forming, on an inner wall of the direct contact hole, a sacrificial liner structure including a first liner, a sacrificial layer, and a second liner;

forming a preliminary direct contact in the direct contact hole on the sacrificial liner structure;

planarizing an upper side of the preliminary direct contact and an upper side of the sacrificial liner structure so that an upper surface of the sacrificial layer is exposed;

removing the sacrificial layer to form an air space around the preliminary direct contact;

forming, on the cell area and the interface area, a bit line stack that contacts the preliminary direct contact and that covers the air space, the bit line stack including a first conductive layer, a second conductive layer, and a third conductive layer, the first conductive layer covering an inlet of the air space;

patterning the bit line stack to form a plurality of bit lines extending in a second horizontal direction and removing side portions of the second liner and the preliminary direct contact in the direct contact hole to form a direct contact; and forming an insulating spacer on the inner wall of the direct contact hole to cover a side wall of the direct contact.

* * * * *